United States Patent
Iwanaga et al.

(10) Patent No.: US 9,130,141 B2
(45) Date of Patent: Sep. 8, 2015

(54) LIGHT-EMITTING DIODE ELEMENT AND LIGHT-EMITTING DIODE DEVICE

(71) Applicant: Panasonic Corporation, Osaka (JP)

(72) Inventors: Junko Iwanaga, Osaka (JP); Akira Inoue, Osaka (JP); Toshiya Yokogawa, Nara (JP); Shigeo Hayashi, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/146,076

(22) Filed: Jan. 2, 2014

(65) Prior Publication Data

US 2014/0110747 A1 Apr. 24, 2014

Related U.S. Application Data

(63) Continuation of application No. PCT/JP2013/005265, filed on Sep. 5, 2013.

(30) Foreign Application Priority Data

Sep. 14, 2012 (JP) .................. 2012-203067

(51) Int. Cl.
*H01L 27/15* (2006.01)
*H01L 21/00* (2006.01)
(Continued)

(52) U.S. Cl.
CPC .............. *H01L 33/642* (2013.01); *H01L 33/38* (2013.01); *H01L 33/62* (2013.01); *H01L 33/14* (2013.01); *H01L 2224/73265* (2013.01)

(58) Field of Classification Search
CPC ... H01L 33/007; H01L 33/0079; H01L 33/32; H01L 33/20; H01L 33/62; H01L 33/486; H01L 27/15; H01L 27/1214; H01L 21/0254

USPC ........... 257/79, 81, 85, 99; 438/29, 39, 46, 47
See application file for complete search history.

(56) References Cited

U.S. PATENT DOCUMENTS

| 8,421,054 B2 * | 4/2013 | Iwanaga et al. ................. 257/11 |
| 2006/0006408 A1 | 1/2006 | Suehiro et al. |

(Continued)

FOREIGN PATENT DOCUMENTS

| JP | 54-016992 A | 2/1979 |
| JP | 55-065483 A | 5/1980 |

(Continued)

OTHER PUBLICATIONS

International Search Report for corresponding International Application No. PCT/JP2013/005265 mailed Oct. 1, 2013.

(Continued)

*Primary Examiner* — Hsien Ming Lee
(74) *Attorney, Agent, or Firm* — Renner, Otto, Boisselle & Sklar, LLP

(57) ABSTRACT

Disclosed is a light-emitting diode element including a first semiconductor layer of a first conductivity type, a second semiconductor layer of a second conductivity type, an active layer. A first electrode is provided on a surface of the second semiconductor layer. A second electrode is provided in a second region of the principal surface of the first semiconductor layer. A conductive layer is arranged such that the conductive layer covers a third region, a fourth region, and a fifth region in the rear surface of the first semiconductor layer. In the rear surface of the first semiconductor layer, the first semiconductor layer includes a sixth region which is not covered with the conductive layer and which overlaps another part of the first electrode. The first semiconductor layer is not provided with a through electrode.

14 Claims, 18 Drawing Sheets

(51) Int. Cl.
*H01L 33/64* (2010.01)
*H01L 33/38* (2010.01)
*H01L 33/62* (2010.01)
*H01L 33/14* (2010.01)

(56) References Cited

U.S. PATENT DOCUMENTS

| | | |
|---|---|---|
| 2006/0267026 A1 | 11/2006 | Kim et al. |
| 2007/0085095 A1 | 4/2007 | Ko et al. |
| 2009/0173955 A1 | 7/2009 | Kim et al. |
| 2012/0113656 A1 | 5/2012 | Iwanaga et al. |
| 2012/0146086 A1 | 6/2012 | Yokobayashi et al. |
| 2013/0009196 A1* | 1/2013 | Iwanaga et al. ............ 257/99 |

FOREIGN PATENT DOCUMENTS

| | | |
|---|---|---|
| JP | 62-262471 A | 11/1987 |
| JP | 2001-308462 A | 11/2001 |
| JP | 2003-332697 A | 11/2003 |
| JP | 2006-339646 A | 12/2006 |
| JP | 2012-124330 A | 6/2012 |
| JP | 2012-124429 A | 6/2012 |
| WO | WO 2011/010436 A1 | 1/2011 |

OTHER PUBLICATIONS

Form PCT/ISA/237 for corresponding International Application No. PCT/JP2013/005265 dated Oct. 1, 2013.

* cited by examiner

LIGHT-EMITTING DIODE ELEMENT AND LIGHT-EMITTING DIODE DEVICE

This is a continuation of International Application No. PCT/JP2013/005265, with an international filing date of Sep. 5, 2013, which claims priority of Japanese Patent Application No. 2012-203067, filed on Sep. 14, 2012, the contents of which are hereby incorporated by reference.

BACKGROUND

1. Technical Field

The present application relates to a light-emitting diode element and relates to a high-output light-emitting diode element.

2. Description of the Related Art

A nitride semiconductor including nitrogen (N) as a Group V element is a prime candidate for a material to make a short-wave light-emitting element because its bandgap is sufficiently wide. Among other things, gallium nitride-based compound semiconductors (which will be referred to herein as "GaN-based semiconductors") have been researched and developed particularly extensively. As a result, blue light-emitting diode (LED) elements, green light-emitting diode elements, and semiconductor laser diodes formed of GaN-based semiconductors have already been used in actual products (See, for example, Japanese Laid-Open Patent Publications No. 2001-308462 and No. 2003-332697).

Light-emitting diode elements commercially available in the present market are manufactured by epitaxially growing a GaN-based semiconductor layer, such as GaN, InGaN, and AlGaN, on a c-plane substrate, and the light-emitting diode element (LED chip) is mounted to a submount. The planar size of a light-emitting diode element (the planar size of the principal surface of the substrate: hereinafter, simply referred to as "chip size") varies depending on the use of the light-emitting diode element. Typical chip size is, for example, 300 µm×300 µm or 1 mm×1 mm.

The arrangement of the electrodes of the light-emitting diode element can be roughly divided into two types. One is the "two-sided electrode type" wherein the p-side electrode and the n-side electrode are provided on the front surface and the rear surface, respectively, of the light-emitting diode element. The other one is the "one-sided electrode type" wherein both the p-side electrode and the n-side electrode are provided on the front surface of the light-emitting diode element.

WO 2011/010436 discloses a light-emitting diode element as described hereinbelow (See FIG. 18 included in WO 2011/010436). The light-emitting diode disclosed in WO 2011/010436 includes an n-type conductive layer 2 formed of a gallium nitride-based compound, a semiconductor multilayer structure 21 which includes a p-type conductive layer 4 and an active layer 3, a p-side electrode 5 provided on the p-type conductive layer 4, a conductor portion 9, and an n-type surface electrode 6. The n-type conductive layer 2 has a principal surface of an m-plane and a rear surface. The semiconductor multilayer structure 21 is provided in a first region 2a of the principal surface of the n-type conductive layer 2. The active layer 3 is interposed between the n-type conductive layer 2 and the p-type conductive layer 4. The conductor portion 9 is provided in a second region 2b of the principal surface of the n-type conductive layer 2. The conductor portion 9 is in contact with an inner wall of a through hole 8. The n-type surface electrode 6 is provided in the second region 2b of the principal surface of the n-type conductive layer 2. The n-type surface electrode 6 is in contact with the conductor portion 9.

Japanese Laid-Open Patent Publication No. 2012-124330 discloses a semiconductor light-emitting element including a semiconductor film which includes an n-type semiconductor layer, an active layer, and a p-type semiconductor layer, an n-side electrode provided on an exposed surface of the n-type semiconductor layer, and a p-side electrode provided on a surface of the p-type semiconductor layer. The exposed surface is formed by partially removing the semiconductor film from a surface of the p-type semiconductor layer. According to Japanese Laid-Open Patent Publication No. 2012-124330, the semiconductor light-emitting element has a current guiding portion which is lying on or inside the n-type semiconductor layer and lying above the p-side electrode and which has a higher electrical conductivity than the electrical conductivity of the n-type semiconductor layer.

SUMMARY

Conventional light-emitting devices have been demanded to reduce generation of heat.

A nonlimiting exemplary embodiment of the present application provides a high-output light-emitting diode element and light-emitting diode device in which generation of heat is reduced.

A light-emitting diode element according to one embodiment of the present disclosure includes: a first semiconductor layer of a first conductivity type which has a principal surface and a rear surface; a second semiconductor layer of a second conductivity type which is provided in a first region of the principal surface of the first semiconductor layer; an active layer interposed between the first semiconductor layer and the second semiconductor layer; a first electrode provided on a surface of the second semiconductor layer, the first semiconductor layer being interposed between the first electrode and the active layer; a second electrode provided in a second region of the principal surface of the first semiconductor layer; and a conductive layer that is arranged such that, in the rear surface of the first semiconductor layer, when viewed from a direction perpendicular to the rear surface, the conductive layer covers a third region lying between the first electrode and the second electrode, a fourth region which is adjacent to the third region and which overlaps at least part of the second electrode, and a fifth region which is adjacent to the third region and which overlaps part of the first electrode, wherein the conductive layer is in contact with the first semiconductor layer, the first semiconductor layer includes, in the rear surface of the first semiconductor layer, a sixth region which is not covered with the conductive layer and which overlaps another part of the first electrode when viewed from a direction perpendicular to the rear surface, and the first semiconductor layer of the first conductivity type is not provided with an electrode penetrating between the principal surface and the rear surface.

According to an embodiment of the present application, a high-output light-emitting diode element and light-emitting diode device in which generation of heat is reduced are realized.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIG. 4A is a graph showing the current dependence of the external quantum efficiency. FIG. 4B is a graph showing the current dependence of the optical output. FIG. 4C is a graph showing the current dependence of the maximum active layer temperature. FIG. 4D is a graph showing the current dependence of the voltage. FIG. 4E is a graph showing the energy at the bottom of the conduction band in the active layer along the cross section taken along line A-A' of FIGS. 3B and 3C.

FIG. 5A is a graph showing the current dependence of the external quantum efficiency. FIG. 5B is a graph showing the current dependence of the optical output. FIG. 5C is a graph showing the current dependence of the voltage.

FIG. 6A is a graph showing the thickness dependence of the external quantum efficiency. FIG. 6B is a graph showing the thickness dependence of the optical output. FIG. 6C is a graph showing the thickness dependence of the voltage.

FIG. 7A is a graph showing the current dependence of the external quantum efficiency. FIG. 7B is a graph showing the current dependence of the optical output. FIG. 7C is a graph showing the current dependence of the voltage.

FIG. 8A is a graph showing the overlap length dependence of the external quantum efficiency. FIG. 8B is a graph showing the overlap length dependence of the optical output. FIG. 8C is a graph showing the overlap length dependence of the voltage. FIG. 8D is a graph showing the overlap length ratio (a5/(a5+a6)) dependence of the external quantum efficiency. FIG. 8E is a graph showing the overlap length ratio dependence of the optical output.

DETAILED DESCRIPTION

Firstly, the basic configurations of the two-sided electrode type and the one-sided electrode type are described.

Figure 1A:
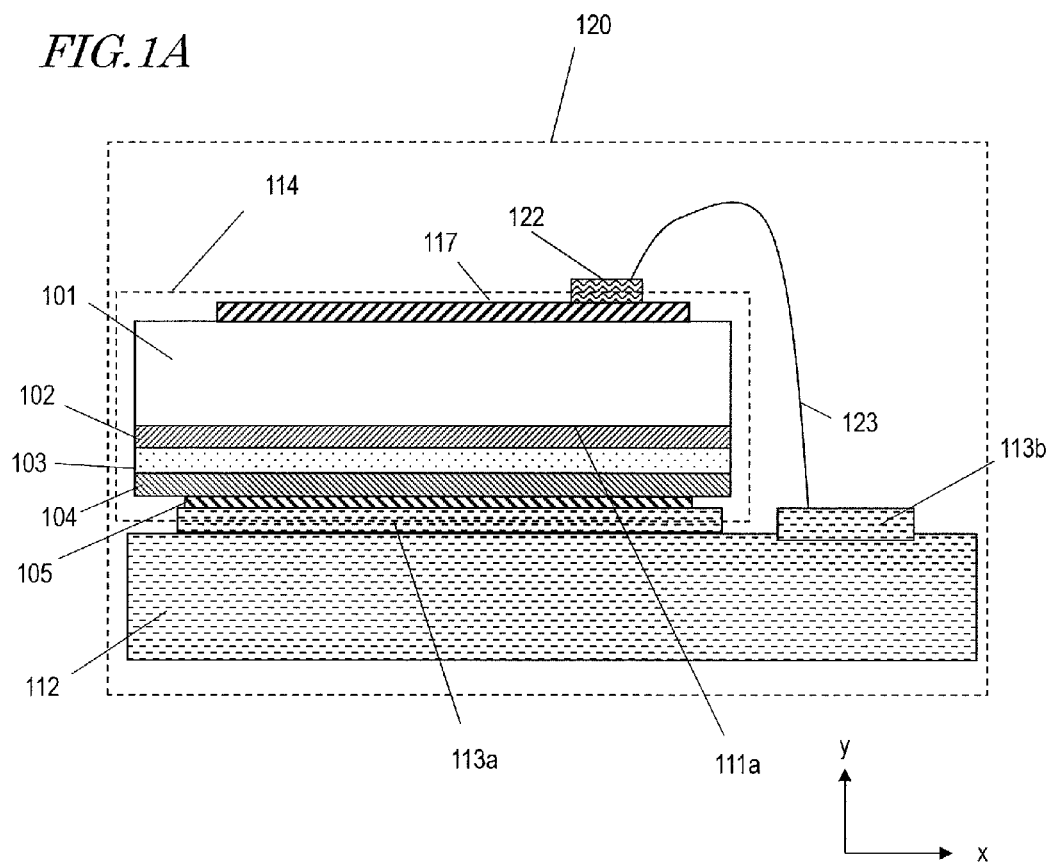
FIG. 1A is a cross-sectional view showing a light-emitting diode device to which a two-sided electrode type light-emitting diode element is mounted.
Figure 1B:
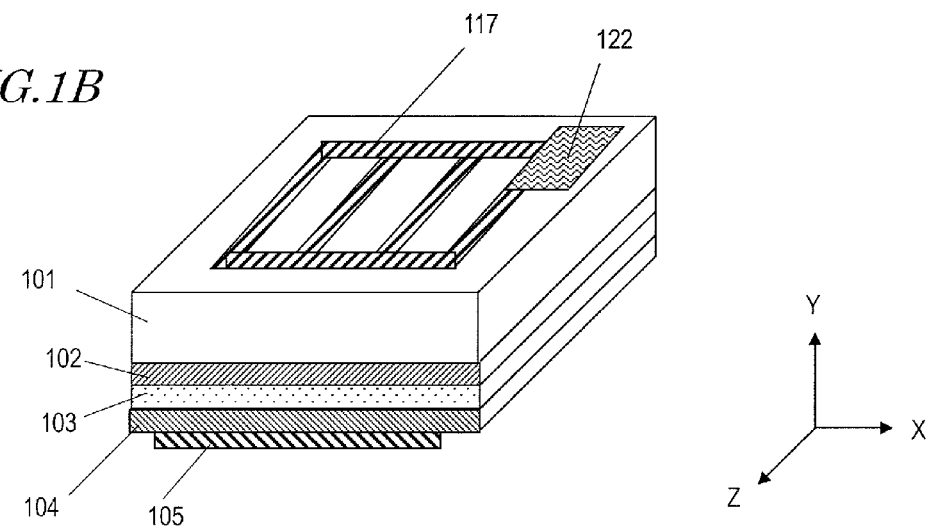
FIG. 1B is a perspective view of the light-emitting diode element.

FIG. 1A is a cross-sectional view showing a light-emitting device 120 in which a two-sided electrode type light-emitting diode element 114 is mounted to a mounting base 112. FIG. 1B is a perspective view of the light-emitting diode element 114. The light-emitting device 120 includes, for example, a structure in which an n-type semiconductor layer 102 formed of GaN, an active layer 103 formed by a quantum well of InGaN and GaN, and a p-type semiconductor layer 104 formed of GaN are stacked on an n-type substrate 101 formed of GaN. A p-side electrode 105 is provided on the p-type semiconductor layer 104. An n-side electrode 117 is provided on the rear surface of the n-type substrate 101. In this example, light outgoing from the active layer 103 is extracted from the rear surface of the n-type substrate 101. Therefore, the n-side electrode 117 is provided in a partial region of the rear surface of the n-type substrate 101 so as not to block the light. In the case of mounting the two-sided electrode type light-emitting diode element, the diode element is arranged in a face-down configuration such that the p-side electrode 105 is positioned on the mounting base 112 side as shown in FIG. 1A. The rear surface of the n-type substrate 101 is provided with a bonding pad 122. The bonding pad 122 is electrically connected to the mounting base 112 via a wire 123.

Figure 2A:
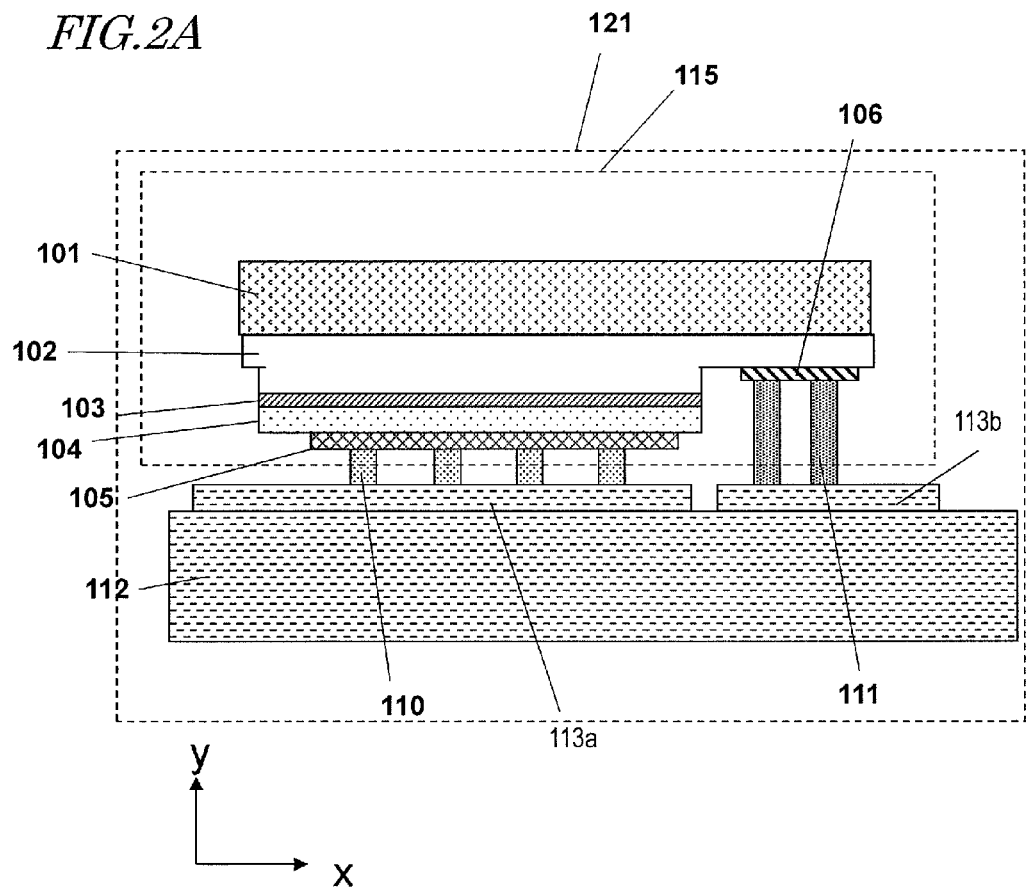
FIG. 2A is a cross-sectional view showing a light-emitting diode device to which a one-sided electrode type light-emitting diode element is mounted.
Figure 2B:
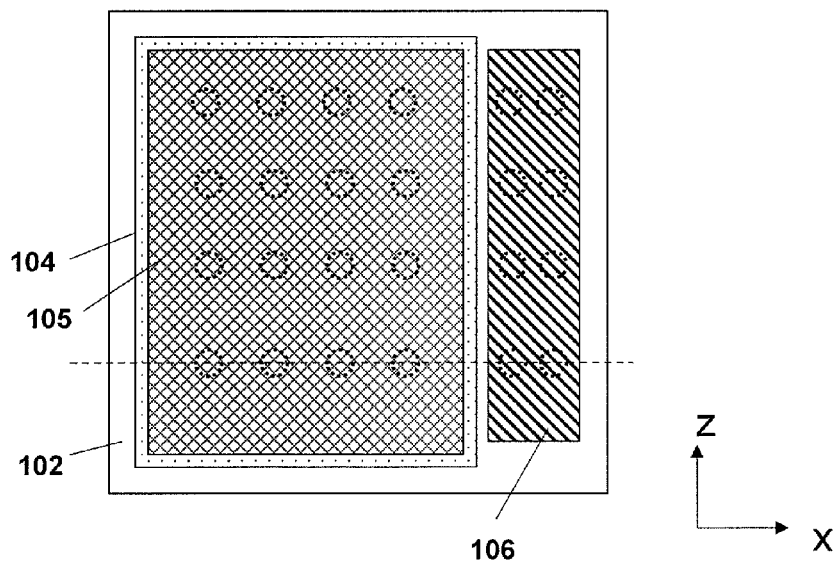
FIG. 2B is a plan view of the light-emitting diode element which is viewed from the principal surface.

FIG. 2A is a cross-sectional view showing a light-emitting device 121 in which a one-sided electrode type light-emitting diode element 115 is mounted to the mounting base 112. FIG. 2B is a plan view of the light-emitting diode element 115 which is viewed from the mounting base 112 side. The light-emitting device 121 includes, for example, a structure in which an n-type semiconductor layer 102 formed of GaN, an active layer 103 formed by a quantum well of InGaN and GaN, and a p-type semiconductor layer 104 formed of GaN are stacked on a substrate 101 formed of an n-type GaN semiconductor or SiC. A p-side electrode 105 is provided on the p-type semiconductor layer 104. An n-side electrode 106 is provided on the n-type semiconductor layer 102 exposed by removing the p-type semiconductor layer 104, the active layer 103, and part of the n-type semiconductor layer 102. The p-side electrode 105 is provided on the p-type semiconductor layer 104. In this example, light produced in the active layer 103 is extracted from the rear surface of the substrate 101. Therefore, in the case of mounting a light-emitting diode element of this type, the diode element is arranged in a face-down configuration such that the p-side electrode 105 and the n-side electrode 106 are positioned on the mounting base 112 side.

The inventors of the present application examined a case where the above-described light-emitting diode device of the prior art includes a high-output type light-emitting diode element. When the light-emitting diode element is a high-output type element, a large current flows so that the light-emitting diode element generates heat, leading to a high temperature. For example, in a case of the two-sided electrode type light-emitting diode element 114, the element generates heat during a high-output operation, leading to a temperature near 400 K. Therefore, it was found that, in some cases, the heat causes the bonding wire 123 that connects the n-side electrode 117 to the mounting base to come off.

In the case of the one-sided electrode type light-emitting diode element 115, it was found that, the electric current concentrates around the n-side electrode 106 during a large current operation to generate heat so that the light emission efficiency decreases in some cases. It was also found that, due to the resistance of the n-type semiconductor layer, a portion of the active layer at a position beyond the n-side electrode 106 is less likely to be biased so that a sufficient electric current would not flow, and a sufficient light emission intensity cannot be obtained in some cases. Thus, in the light-emitting device 121, the efficiency of light emitted to the outside relative to the input electric power deteriorates. Such a problem can occur particularly when a substrate having a low electrical conductivity is used, or when the thickness of the n-type semiconductor layer is reduced to 20 μm or less, in the one-sided electrode type light-emitting diode element 115.

As described above, the two-sided electrode type has such a configuration that the current density is uniform and large electric power can be easily input, although however there is a problem of reliability in mounting. The one-sided electrode type has high reliability in mounting because it is mounted using a bump, although however when large electric power is input the current density is nonuniform so that the efficiency deteriorates, or light extraction deteriorates so that the efficiency deteriorates. In the case of a nitride semiconductor realized by non-polar plane growth, the impurity concentration of the n-type conductive layer cannot be increased from the viewpoint of preventing deterioration of the crystal quality. Therefore, in the nitride semiconductor realized by non-polar plane growth, the impurity concentration of the n-type conductive layer is low, the resistance readily increases, and heat is readily generated.

In view of the above problems, the inventors of the present application conceived a light-emitting diode element and a light-emitting diode device which have a novel configuration. An embodiment of the present disclosure is as described below.

A light-emitting diode element according to one embodiment of the present disclosure includes: a first semiconductor layer of a first conductivity type which has a principal surface and a rear surface; a second semiconductor layer of a second conductivity type which is provided in a first region of the principal surface of the first semiconductor layer; an active layer interposed between the first semiconductor layer and the second semiconductor layer; a first electrode provided on a surface of the second semiconductor layer, the first semiconductor layer being interposed between the first electrode and the active layer; a second electrode provided in a second region of the principal surface of the first semiconductor layer; and a conductive layer that is arranged such that, in the rear surface of the first semiconductor layer, when viewed from a direction perpendicular to the rear surface, the conductive layer covers a third region lying between the first electrode and the second electrode, a fourth region which is adjacent to the third region and which overlaps at least part of the second electrode, and a fifth region which is adjacent to the third region and which overlaps part of the first electrode, wherein the conductive layer is in contact with the first semiconductor layer, the first semiconductor layer includes, in the rear surface of the first semiconductor layer, a sixth region which is not covered with the conductive layer and which overlaps another part of the first electrode when viewed from a direction perpendicular to the rear surface, and the first semiconductor layer of the first conductivity type is not provided with a through electrode penetrating between the principal surface and the rear surface.

The conductive layer is formed of a metal, and the following relationship may be satisfied:

$$0.050 \leq \frac{a5}{a5 + a6} \leq 0.250$$

where a5 is a width of the fifth region, and a6 is a width of the sixth region.

The conductive layer is formed of a conductive transparent material, and the following relationship may be satisfied:

$$0.125 \leq \frac{a5}{a5 + a6} \leq 0.750$$

where a5 is a width of the fifth region, and a6 is a width of the sixth region.

A thickness of the first semiconductor layer of the first conductivity type may be not more than 20 μm.

A maximum thickness of the conductive layer may be not less than 4 μm and not more than 100 μm.

The first semiconductor layer may have an uneven structure provided in the sixth region of the rear surface.

The conductive layer may have an uneven structure on a front surface thereof.

The first semiconductor layer may include an epitaxial growth layer of the first conductivity type provided on the active layer side, and a semiconductor substrate of the first conductivity type which is provided on the conductive layer side.

An average value of a total thickness of the semiconductor substrate and the conductive layer in the third, fourth, and fifth regions may be greater than an average value of a thickness of the semiconductor substrate in the sixth region.

A minimum value of a total thickness of the semiconductor substrate and the conductive layer in the third, fourth, and fifth regions may be greater than a minimum value of a thickness of the semiconductor substrate in the sixth region.

When viewed from the rear surface of the first semiconductor layer, the fourth region accords to the second electrode.

The first semiconductor layer, the second semiconductor layer, and the active layer may be formed of a GaN-based non-polar semiconductor or GaN-based semi-polar semiconductor.

The first conductivity type may be n-type.

A light-emitting diode device according to one embodiment of the present disclosure includes: a mounting base which has a mounting surface and which includes a first terminal and a second terminal provided on the mounting surface; and any of the above-described light-emitting diode elements, the first electrode and the second electrode being arranged so as to be electrically connected to the first terminal and the second terminal, respectively.

Hereinafter, embodiments of a light-emitting diode element and a light-emitting diode device of the present disclosure are described in detail with reference to the drawings. In the embodiments described below, the n-type is the first conductivity type, and the p-type is the second conductivity type. However, the first conductivity type may be the p-type, and the second conductivity type may be the n-type.

(Embodiment 1)

Figure 3A:
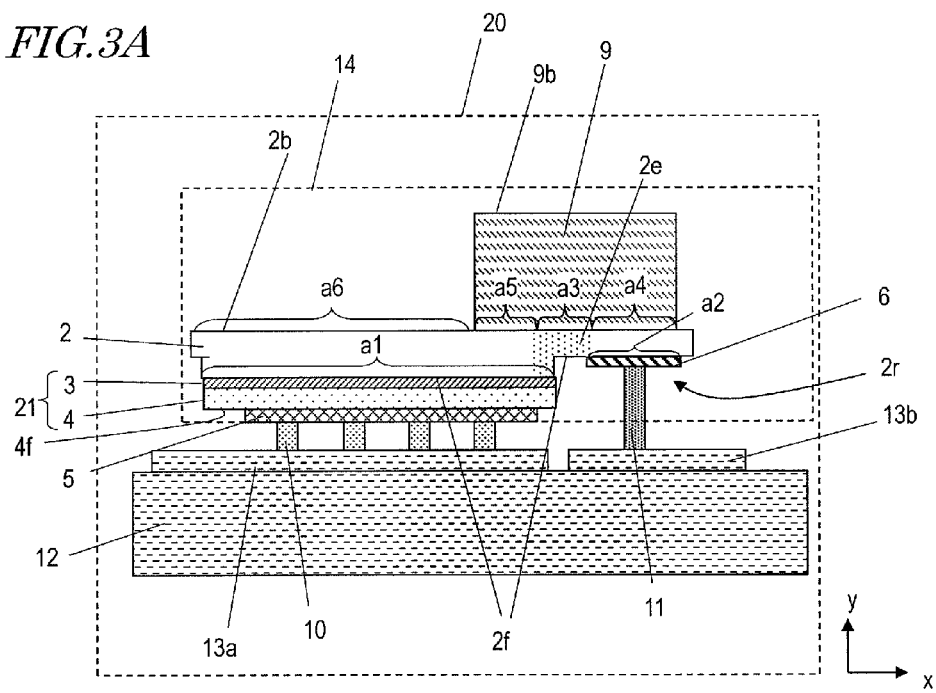
FIG. 3A is a cross-sectional view of a light-emitting diode device of Embodiment 1.

FIG. 3A is a cross-sectional view showing Embodiment 1 of a light-emitting diode device of the present disclosure. As shown in FIG. 3A, a light-emitting diode device 20 of the present embodiment is arranged such that a light-emitting diode element (chip) 14 is mounted to a mounting base 12 in a face-down configuration. In the example described herein, the n-type semiconductor layer is formed prior to the p-type semiconductor layer, and an electrode is provided on the p-type semiconductor layer side, although any one of the n-type semiconductor layer and the p-type semiconductor layer may be formed prior to the other.

The light-emitting diode element 14 includes an n-type semiconductor layer (first semiconductor layer) 2 which is formed of n-type GaN and a semiconductor multilayer structure 21. The n-type semiconductor layer 2 has a principal surface (front surface) $2f$ and a rear surface $2b$. In the fields of semiconductors, it is common that a "principal surface" refers to a surface of a semiconductor substrate on which a semiconductor multilayer structure is to be formed. A "rear surface" refers to the other surface of the semiconductor substrate. Therefore, in the specification of the present application, one of the surfaces on a side where the semiconductor multilayer structure 21 is provided is referred to as the principal surface $2f$. The rear surface $2b$ is shown on the upper side in the drawing because the light-emitting diode element (chip) 14 is mounted in a face-down configuration as described above, although the rear surface $2b$ and the principal surface $2f$ do not mean the positions along the vertical direction in the drawing or the vertical positions in an actual light-emitting diode device.

The n-type semiconductor layer 2 that is formed of GaN is formed on, for example, an n-type GaN substrate using epitaxial growth, and formed by removing the n-type GaN substrate. As will be described later, the n-type semiconductor layer 2 may include the grown n-type semiconductor layer and part of the n-type GaN substrate.

Light produced in the semiconductor multilayer structure 21 is extracted from the rear surface $2b$ of the n-type semiconductor layer 2. The light extraction efficiency can be improved by decreasing the thickness of the n-type semiconductor layer 2 as much as possible so that the absorption loss caused by the n-type semiconductor layer 2 is reduced. For example, the thickness of the n-type semiconductor layer 2 is not less than 1 μm and not more than 30 μm. When the thickness is from 2 μm to 15 μm, the light extraction efficiency can be further improved. When the thickness is from 2 μm to 5 μm, the light extraction efficiency can be still further improved.

On the other hand, when the thickness of the n-type semiconductor layer 2 is small, electric current concentration occurs around the n-side electrode as described above, and the light emission efficiency can deteriorate due to the generated heat. This problem occurs particularly when the thickness of the n-type semiconductor layer 2 is not more than 20 μm but can be solved by providing in the light-emitting diode device 20 a conductive layer 9 which will be described in detail below. That is, in the light-emitting diode device 20, particularly when the thickness of the n-type semiconductor layer 2 is not more than 20 μm, the thickness of the n-type semiconductor layer 2 is decreased, whereby generation of heat which could be caused due to electric current concentration can be prevented while the absorption loss is reduced, and the light extraction efficiency can be improved.

As shown in FIG. 3A, the principal surface $2f$ of the n-type semiconductor layer 2 includes the first region a1 and the second region a2. The principal surface $2f$ has a recessed portion $2r$, and the second region a2 lies at the bottom of the recessed portion $2r$. That is, when the recessed portion $2r$ is provided, the principal surface $2f$ includes a bottom surface of the recessed portion $2r$. The first region a1 and the second region a2 do not overlap. These regions are defined for specifying the positions of semiconductor structures and electrodes which will be described below and do not mean that the boundary lines of these regions are provided in the principal surface $2f$. However, the contours of semiconductor layers and electrodes are positioned at the boundaries of these regions.

The semiconductor multilayer structure 21 includes an active layer 3 and a p-type semiconductor layer (second semiconductor layer) 4. The p-type semiconductor layer 4 is formed of GaN and is provided in the first region a1 in the principal surface $2f$ of the n-type semiconductor layer 2. The active layer 3 is provided between the n-type semiconductor layer 2 and the p-type semiconductor layer 4. The semiconductor multilayer structure 21 may include another semiconductor layer interposed between the n-type semiconductor layer 2 and the active layer 3 or between the active layer 3 and the p-type semiconductor layer 4.

The active layer 3 includes a quantum well structure formed by stacked layers of InGaN and GaN, for example. Each of the n-type semiconductor layer 2, the active layer 3, and the p-type semiconductor layer 4 is an epitaxial growth layer. For example, it has c-plane, m-plane, a-plane, +r plane, −r plane, (11-22) plane, (11-2-2) plane, (10-11) plane, (10-1-1) plane, (20-21) plane, or (20-2-1) plane. It may have an offset angle of about 10° or less. When the active layer 3 is formed of a GaN-based semiconductor and has a non-polar or semi-polar plane selected from among the aforementioned crystal planes, a light-emitting diode element and a light-emitting diode device which can provide high efficiency and high output can be realized.

Figure 3B:
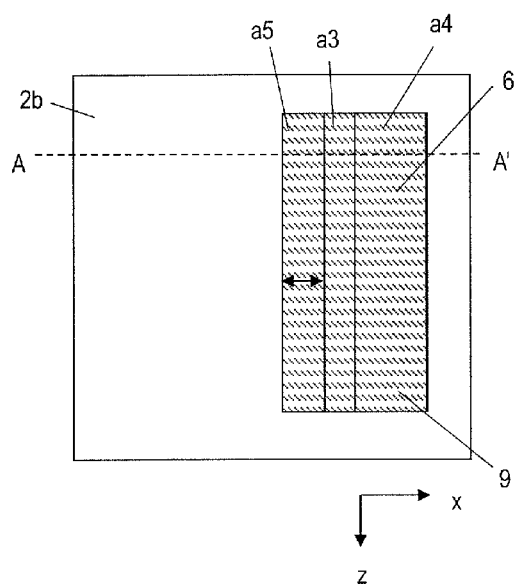
FIGS. 3B and 3C are plan views of the light-emitting diode element of Embodiment 1 which is viewed from the rear surface and from the principal surface, respectively.
Figure 3C:
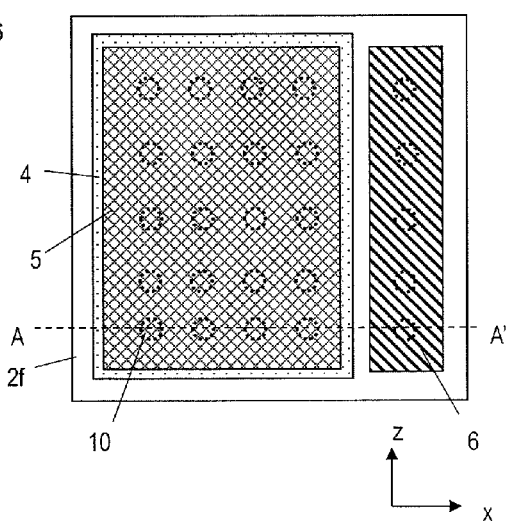

FIG. 3C is a plan view of the light-emitting diode element 14 which is viewed from the principal surface 2f side. A cross-sectional view of the light-emitting diode element 14 taken along line A-A' of FIG. 3C is shown in FIG. 3A. As shown in FIGS. 3A and 3C, a p-side electrode (first electrode) 5 is provided on a surface 4f of the p-type semiconductor layer 4 which is opposite to the side where the active layer 3 is provided, i.e., on the p-type semiconductor layer 4. The p-side electrode 5 is provided in the first region a1 in the principal surface 2f of the n-type semiconductor layer 2. Further, an n-side electrode (second electrode) 6 is provided in the second region a2 of the principal surface 2f of the n-type semiconductor layer 2. In the present embodiment, the p-side electrode 5 is formed with Ni/Au layers, for example, and the n-side electrode 6 is formed with Ti/Al layers, for example. Note that, however, the configurations of the p-side electrode 5 and the n-side electrode 6 are not limited to these examples.

FIG. 3B is a plan view of the light-emitting diode element 14 which is viewed from the rear surface 2b side. A cross-sectional view of the light-emitting diode element 14 taken along line A-A' of FIG. 3B is shown in FIG. 3A. As shown in FIGS. 3A and 3B, a conductive layer 9 is provided on the rear surface 2b of the n-type semiconductor layer 2. The conductive layer 9 is formed of n-type GaN, SiC, or semiconductor containing Si, for example. More specifically, the conductive layer 9 may be formed with an n-type GaN substrate provided for growth of the n-type semiconductor layer 2 and formation of the semiconductor multilayer structure 21. The conductive layer 9 has electrical conductivity and, more specifically, has a resistance value generally equal to or lower than that of the n-type semiconductor layer 2. The resistance of the conductive layer 9 in a direction parallel to the rear surface 2b may be generally equal to the resistance of the n-type semiconductor layer 2.

The conductive layer 9 is provided on the n-type semiconductor layer 2 so as to cover the third region a3, the fourth region a4, and the fifth region a5 in the rear surface 2b of the n-type semiconductor layer 2. Here, the third region a3 lies between the p-side electrode 5 and the n-side electrode 6 when viewed from a direction perpendicular to the rear surface 2b of the n-type semiconductor layer 2 (y direction). That is, the third region a3 is in contact with a portion 2e of the n-type semiconductor layer 2 which lies between the p-side electrode 5 and the n-side electrode 6 when viewed from a direction perpendicular to the rear surface 2b of the n-type semiconductor layer 2 (y direction). When viewed from a direction perpendicular to the rear surface 2b (y direction), the fourth region a4 is adjacent to the third region a3 and overlaps at least part of the n-side electrode 6. When viewed from a direction perpendicular to the rear surface 2b (y direction), the fifth region a5 is adjacent to the third region a3 and overlaps part of the p-side electrode 5. These regions are also defined for specifying the position of the conductive layer 9 over the rear surface 2b as previously described and do not mean that the boundaries of these regions are formed in the rear surface 2b.

As shown in FIGS. 3A and 3B, in the rear surface 2b, the third region a3 lies between the fourth region a4 and the fifth region a5, and the third region a3, the fourth region a4, and the fifth region a5 are continuous. The n-type semiconductor layer 2 is electrically connected to the conductive layer 9. The n-type semiconductor layer 2 has, in the rear surface 2b, the sixth region a6 which is not covered with the conductive layer 9 and which overlaps a part of the p-side electrode 5 when viewed from a direction perpendicular to the rear surface 2b. That is, when viewed from a direction perpendicular to the rear surface 2b, the part of the rear surface 2b overlapping the p-side electrode 5 includes the fifth region a5 that is covered with the conductive layer 9 and the sixth region a6 that is not covered with the conductive layer 9.

Note that, as shown in FIGS. 3A and 3B, the n-type semiconductor layer 2 is not provided with an electrode penetrating between the principal surface 2f and the rear surface 2b, specifically between the second region a2 of the principal surface 2f and the fourth region a4 of the rear surface 2b.

The maximum thickness of the conductive layer 9 is not less than 1 μm and not more than 100 μm. The conductive layer 9 may overlap almost all the area of the n-side electrode 6 when viewed from a direction perpendicular to the rear surface 2b of the n-type semiconductor layer 2. That is, the fourth region a4 may be generally identical with the second region a2 when viewed from a direction perpendicular to the rear surface 2b of the n-type semiconductor layer 2.

On the other hand, when viewed from a direction perpendicular to the rear surface 2b of the n-type semiconductor layer 2, the conductive layer 9 may overlap the p-side electrode 5 by a distance which is equal to or smaller than a half of the width. Specifically, in a direction perpendicular to the boundary between the third region a3 and the fifth region a5 (-x direction in FIG. 3B), the conductive layer 9 may overlap the p-side electrode 5 by a length which is greater than 0 μm and smaller than a ½ of the width in the vertical direction of the p-side electrode 5. For example, when the size of the light-emitting diode element 14 is about 1 mm×1 mm when viewed from a direction perpendicular to the rear surface 2b of the n-type semiconductor layer 2, the overlap length of the conductive layer 9 with the p-side electrode 5 may be not less than 1 μm and not more than 300 μm. With this arrangement, more than a half of the n-type semiconductor layer 2 is exposed without being covered with the conductive layer 9.

As shown in FIG. 3A, the light-emitting diode element 14 which has the above-described configuration is mounted to the mounting base 12 in a face-down configuration. Specifically, the light-emitting diode element 14 is arranged such that terminals 13a and 13b provided on the mounting base face the p-side electrode 5 and the n-side electrode 6 respectively. The terminal 13a and the p-side electrode 5 are connected through bumps 10 so that they are electrically connected. Likewise, the terminal 13b and the n-side electrode 6 are also connected through the bumps 10 so that they are electrically connected.

According to the light-emitting diode element 14 and the light-emitting diode device 20 of the present embodiment, the conductive layer 9 is provided so as to be in contact with the portion 2e lying between the p-side electrode 5 and the n-side electrode 6 which are provided on the principal surface 2f side of the n-type semiconductor layer 2. Therefore, the cross-sectional area of the pathway of an electric current flowing from the active layer 3 to the n-side electrode 6 can be increased. Thus, generation of heat which would be caused by increased current density around the n-side electrode 6 is prevented, and increase of the resistance of the n-type semiconductor layer 2 which would be caused by the heat is prevented. Further, decrease of the light emission efficiency which would be caused by the increase of the temperature of the active layer 3 is prevented. Thus, a large electric current of the active layer 3 can be injected, and a light-emitting diode element 14 and a light-emitting diode device 20 which can provide high efficiency and high output are realized.

Further, according to the present embodiment, the conductive layer 9 is provided, and therefore, the cross-sectional area of the pathway of an electric current flowing from the active layer 3 to the n-side electrode 6 can be increased even when the thickness of the n-type semiconductor layer 2 is decreased. Thus, by decreasing the thickness of the n-type semiconductor layer 2, light produced in the active layer 3 is poorly absorbed by the n-type semiconductor layer to improve the light extraction efficiency.

Further, the n-side electrode 6 and the p-side electrode 5 are provided on the principal surface 2f, and these electrodes and the mounting base are connected via the bumps. Therefore, there is no concern about coming off of the wire which would occur in the case of wire bonding mounting, and the reliability in mounting can be improved.

Therefore, according to the present embodiment, the front-surface electrode configuration is adopted. Hence, high reliability in mounting is secured, and at the same time, injection of a large electric current and desirable light extraction, which are difficult in the front-surface electrode configuration according to the prior art, can be realized.

Note that, in the present embodiment, the semiconductor multilayer structure 21 includes the active layer 3 and the p-type semiconductor layer 4, but may further include an overflow stopper layer interposed between the active layer 3 and the p-type semiconductor layer 4. The overflow stopper layer has the effect of preventing overflow of carriers from the active layer 3 to improve the light emission efficiency. The overflow stopper layer is formed of, for example, an AlGaN layer. Further, a reflection electrode formed of silver, for example, may be provided on the surface of the p-side electrode 5 to extract greater amount of the light from the rear surface of the n-type semiconductor layer 2. In the present embodiment, these features may be taken into the configuration when necessary.

Hereinafter, an example of a light-emitting diode element manufacturing method of the present embodiment is described with reference to FIGS. 3A to 3C.

Firstly, an n-type GaN substrate of which principal surface is the c-plane is provided. In the present embodiment, semiconductor layers are sequentially formed on the substrate by an MOCVD (Metal Organic Chemical Vapor Deposition) method. On the n-type GaN substrate, a 2-15 μm thick GaN layer is formed as the n-type semiconductor layer 2. Specifically, a GaN layer is deposited on the n-type GaN substrate 1 that is formed of GaN by supplying TMG (Ga(CH$_3$)$_3$), TMA (Al(CH$_3$)$_3$), and NH$_3$ at 1100° C., for example. In this step, an Al$_u$Ga$_v$In$_w$N layer (u≥0, v≥0, w≥0) may be formed as the n-type semiconductor layer 2, instead of the GaN layer. Further, another substrate may be used instead of an n-type GaN substrate.

Then, an active layer 3 is formed on the n-type semiconductor layer 2. The active layer 3 has a 81 nm thick GaInN/GaN multi-quantum well (MQW) structure which is realized by, for example, alternately stacking 9 nm thick Ga$_{0.9}$In$_{0.1}$N well layers and 9 nm thick GaN barrier layers. While the Ga$_{0.9}$In$_{0.1}$N well layers are formed, the growth temperature may be decreased to 800° C. in order to enhance incorporation of In.

On the active layer 3, a 70 nm thick p-type semiconductor layer 4 formed of GaN is formed by supplying TMG, TMA, NH$_3$, and Bis(cyclopentadienyl)magnesium (hereinafter, referred to "Cp$_2$Mg". Magnesium included in Cp$_2$Mg serves as the p-type impurity. The p-type semiconductor layer 4 may have a p-GaN contact layer (not shown) on the surface thereof. As the p-type semiconductor layer 4, for example, a p-AlGaN layer may be formed instead of the GaN layer.

After the end of the above-described epitaxial growth step by an MOCVD method, chlorine dry etching is performed to partially remove the p-type semiconductor layer 4 and the active layer 3 to form a recessed portion 2r. IN this way, the second region a2 of the n-type semiconductor layer 2 is exposed.

Then, the n-side electrode 6 is formed with, for example, a 10 nm thick Ti layer and a 100 nm thick Al layer on the second region a2 of the n-type semiconductor layer 2. On the other hand, the p-side electrode 5 is formed with, for example, a 7 nm thick Ni layer and a 70 nm thick Au layer on the p-type semiconductor layer 4 in the first region a1.

Thereafter, a heat treatment is performed at a temperature of about 50° C. to 650° C. for about 5 minutes to 20 minutes. This heat treatment can reduce the contact resistance between the semiconductor layer and the electrode.

Then, the n-type GaN substrate is partially removed by etching or laser processing to form the conductive layer 9.

As a result, the light-emitting diode element 14 is completed. The light-emitting diode element 14 may be mounted to the mounting base 12 by a known method to complete the light-emitting diode device 20. In the above-described manufacturing method, the respective conductive layers and electrode layers can be formed by known manufacturing techniques.

Hereinafter, the results of a light-emitting diode element of the present embodiment, which were calculated by simulation, are described together with the characteristics of a light-emitting diode element which has a conventional configuration.

The configuration of a light-emitting diode element according to an inventive example used in the simulation is described. The configuration of the light-emitting diode element is as shown in FIGS. 3A to 3C. The length in the x-axis direction of the p-side electrode 5 is 400 μm. The length in the x direction of the n-side electrode 6 is 60 μm. The gap between the p-side electrode 5 and the n-side electrode 6 (the length in the x direction of the third region a3) is 40 μm. The length in the z-axis direction of the light-emitting diode element is 1 mm. The calculated values were increased by a factor of two, whereby the characteristics were shown as the characteristics of an element of 1 mm×1 mm, in the drawings mentioned below.

The n-type semiconductor layer 2 and the conductive layer 9 are each formed of GaN, in which the impurity concentration is $2\times10^{18}$ cm$^{-3}$. The thickness of the n-type semiconductor layer 2 is 5 μm. The thickness of the conductive layer 9 is 30 μm.

The conductive layer 9 completely overlaps the n-side electrode 6 (the length in the x direction of the fourth region a4 is 60 μm) and overlaps the p-side electrode 5 by a length of 100 μm in the x direction (the length in the x direction of the fifth region a5 is 100 μm).

A light-emitting diode element of a comparative example has the same configuration as that of the inventive example of the present embodiment except that the comparative example diode element does not have the conductive layer 9.

Figure 4A:
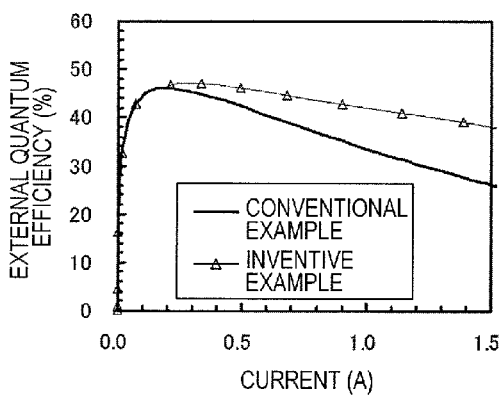
FIGS. 4A to 4E show the results of the light emission characteristics of the light-emitting diode element of Embodiment 1 which were obtained by simulation.
Figure 4B:
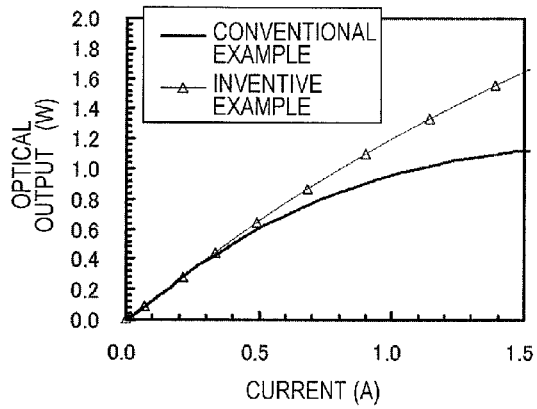
Figure 4C:
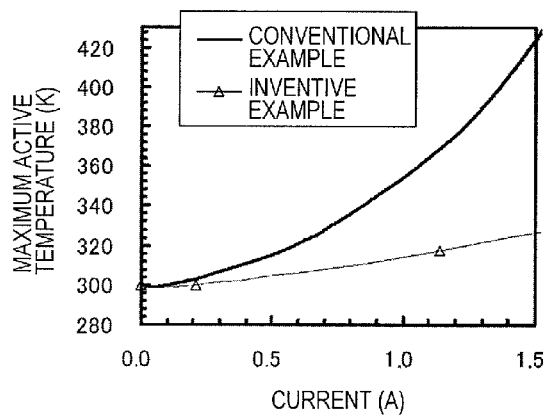
Figure 4D:
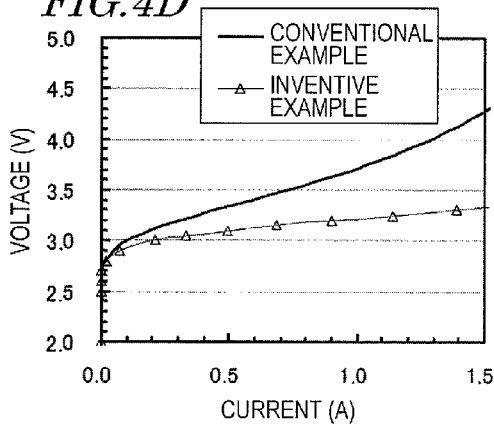
Figure 4E:
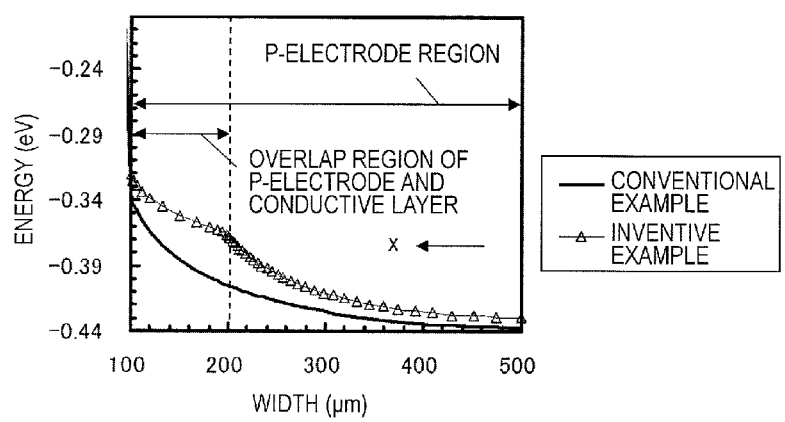

FIG. 4A is a graph showing the current dependence of the external quantum efficiency (EQE). FIG. 4B is a graph showing the current dependence of the optical output. FIG. 4C is a graph showing the current dependence of the maximum active layer temperature. FIG. 4D is a graph showing the current dependence of the voltage. FIG. 4E is a graph showing the energy at the bottom of the conduction band in the active layer along the cross section taken along line A-A' of FIGS. 3B and 3C, where the horizontal axis represents the value of the width which was measured form the boundary between the third region a3 and the fifth region a5 in the negative direction of the x-axis.

As seen from FIG. 4A and FIG. 4B, in the conventional configuration, the efficiency and the optical output decrease with an increase of the electric current, whereas high efficiency and optical output are also maintained even in a large current range according to the inventive example. This is because, in the conventional configuration, as the electric current becomes larger, the current density increases in the n-side electrode and a portion of the n-type semiconductor layer near the n-side electrode so that the temperature of that region increases due to Joule's heat, and accordingly, the carrier mobility decreases so that the resistance increases. The increase of the chip temperature decreases the internal quantum efficiency inside the active layer. When the n-type conductive layer has an increased resistance, a larger voltage is necessary for the flow of the same electric current. Therefore, the input electric power increases, and that is converted to heat, thereby accelerating increase of the temperature. FIG. 4C illustrates that a difference in temperature of about 100 K is caused when an electric current of 1.5 A flows.

FIG. 4E demonstrates that, as the value of the energy is larger, the active layer is more biased so that the amount of light emission increases. In this inventive example, the resistance between the n-side electrode 6 and the p-side electrode 5 is small due to the conductive layer 9. The voltage is more readily applied to the active layer 3. That is, in this inventive example, the conductive layer is provided at a specific position of the n-type semiconductor layer 2 to disperse the electric current into the conductive layer 9, whereas the electric current flows inside the n-type semiconductor layer in the conventional configuration. Therefore, the current density in the n-type semiconductor layer 2 decreases, generation of heat is reduced, and increase of the resistance of the n-type semiconductor layer 2 is prevented. Thus, even when a larger electric current flows, decrease of the efficiency and optical output is prevented. Also, as shown in FIG. 4D, the element resistance is low, and therefore, the driving voltage can be set to a low level.

Large part of light from the active layer 3 that is in contact with a portion of the n-type semiconductor layer 2 which is not covered with the conductive layer 9 is extracted from the rear surface 2b of the n-type semiconductor layer 2. Therefore, the absorption inside the semiconductor layer is small, and the light extraction efficiency is high.

That is, according to a light-emitting diode element of this inventive example, the average total thickness of the portion 2e lying between the n-side electrode 6 and the p-side electrode 5 and a portion of the n-type semiconductor layer 2 which is adjacent to the portion 2e and which is provided on the rear surface side of the active layer 3 and the conductive layer 9 can be large so that a large electric current is allowed to flow through the light-emitting diode element. On the other hand, the average thickness of the remaining part of the n-type semiconductor layer 2 which is provided on the rear side of the active layer 3 is decreased to improve light extraction.

Figure 5A:
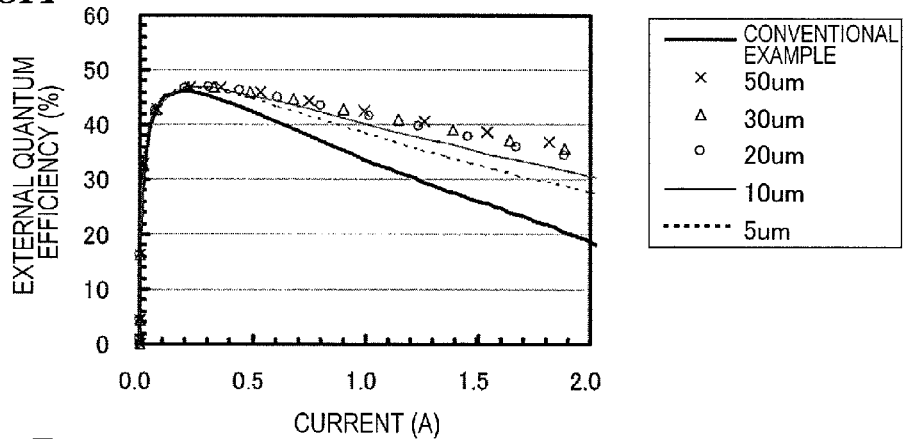
FIGS. 5A to 5C show the results of the light emission characteristics of the light-emitting diode element of Embodiment 1 which were obtained by simulation, with the conductive layer having varying thicknesses, 5 μm, 10 μm, 20 μm, 30 μm, and 50 μm while the length of the conductive layer being fixed.
Figure 5B:
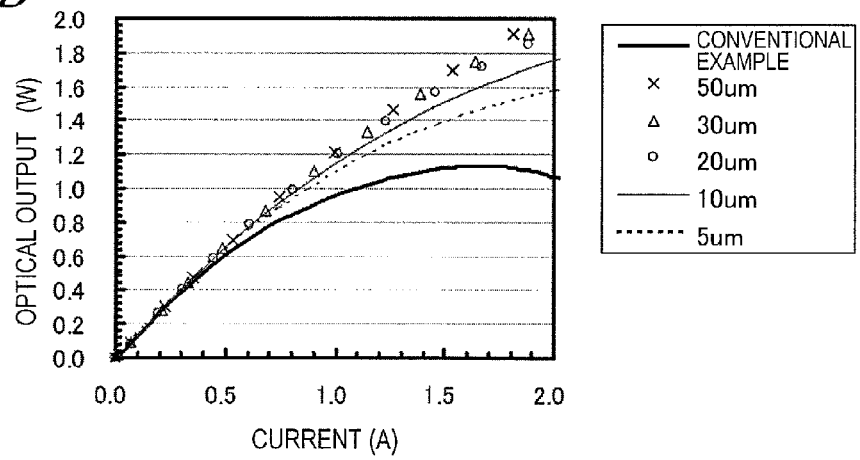
Figure 5C:
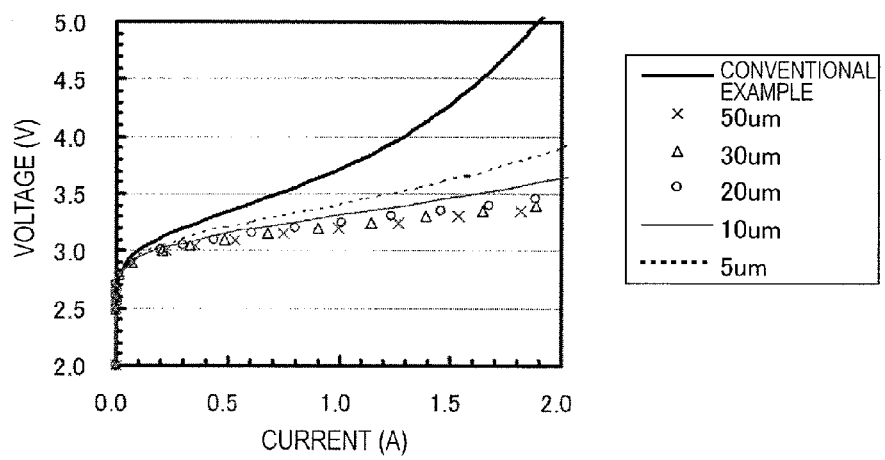

FIGS. 5A to 5C show the results of a simulation which was carried out with the conductive layer 9 having varying thicknesses, 5 μm, 10 μm, 20 μm, 30 μm, and 50 μm while the length of the conductive layer 9 being fixed. FIG. 5A shows the current dependence of the external quantum efficiency (EQE). FIG. 5B shows the current dependence of the optical output. FIG. 5C shows the current dependence of the voltage.

It is seen from FIGS. 5A-5C that, according to this inventive example, the conductive layer 9 allows excellent characteristics, such as greatly improved efficiency and optical output in a large electric current range, a small element resistance, and a low driving voltage, as compared with a conventional configuration which does not have a conductive layer. Particularly, even when the thickness of the conductive layer 9 is 5 μm, these characteristics are greatly improved.

Figure 6A:
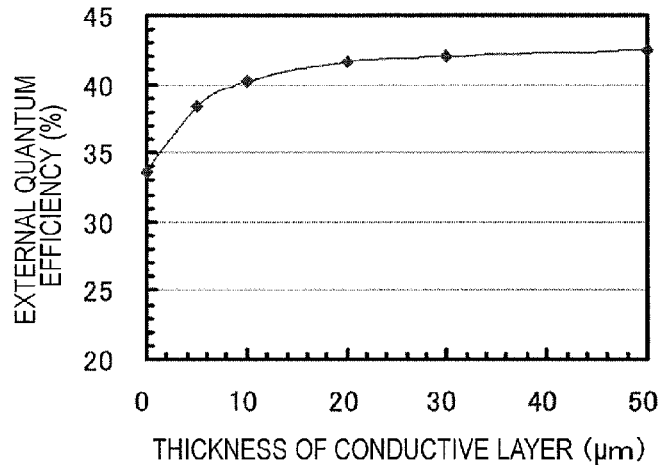
FIGS. 6A to 6C show graphs converted from the results shown in FIGS. 5A to 5C with respect to the thickness of the conductive layer.
Figure 6B:
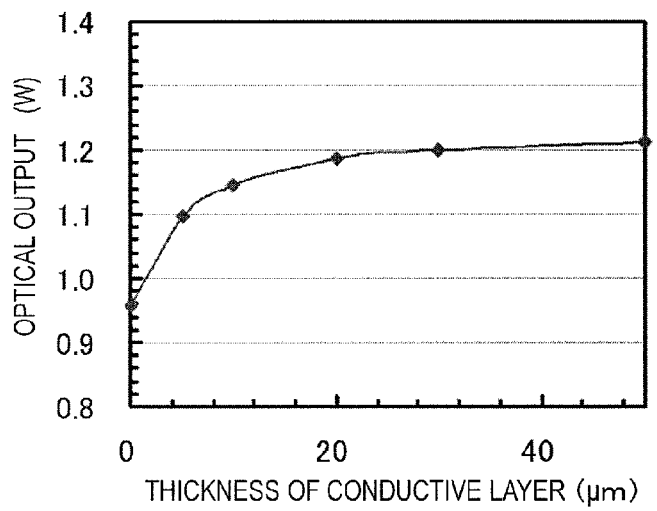
Figure 6C:
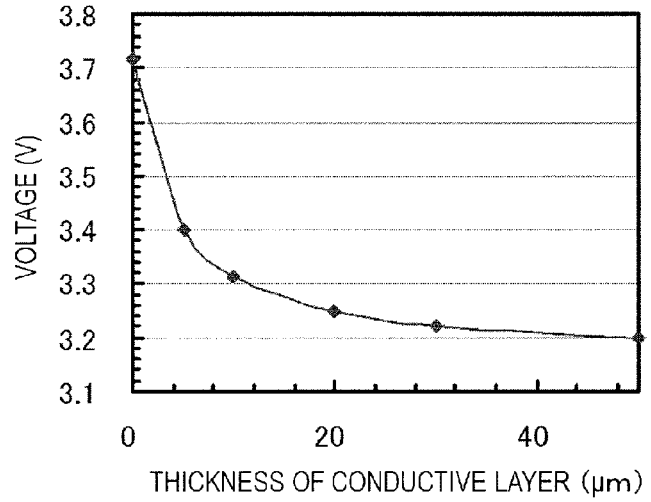

FIGS. 6A to 6C show graphs converted from the results shown in FIG. 5, illustrating the light emission characteristics in the operation with a current of 1 A with respect to the thickness of the conductive layer 9 over the horizontal axis. FIG. 6A shows the thickness dependence of the external quantum efficiency (EQE). FIG. 6B shows the thickness dependence of the optical output. FIG. 6C shows the thickness dependence of the voltage. It is seen from FIG. 6 that the characteristics sharply improve due to the presence of the conductive layer 9. It is seen from these graphs that the effect of improving the characteristics is remarkably achieved when the thickness of the conductive layer 9 is about 4 μm. Although the effect of improving the characteristics is saturating when the thickness is about 20 μm, no problem occurs in the characteristics of the light-emitting diode element of the present embodiment even when the conductive layer 9 is still greater. Therefore, the thickness of the conductive layer 9 does not have a particular upper limit. However, the thickness of the conductive layer may be limited to 100 μm or smaller in light of problems in the process of manufacture, such as problems that a certain length of time is practically required for formation of the conductive layer 9 and that formation of the conductive layer 9 having a large thickness is difficult. From the viewpoint of sufficiently improving the above-described characteristics of the light-emitting diode element and preventing the increase of the manufacturing cost, the thickness of the conductive layer 9 may be not less than 5 μm and not more than 30 μm.

Figure 7A:
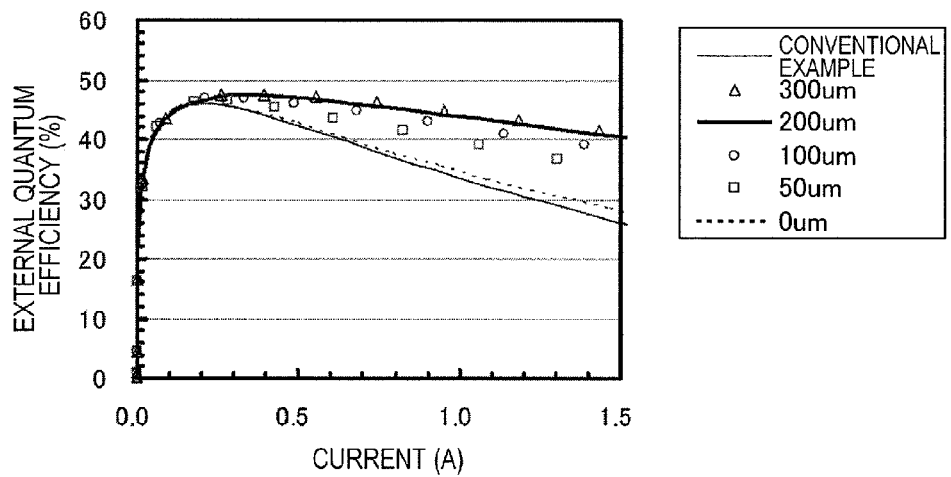
FIGS. 7A to 7C show the results of a simulation for the light emission characteristics of the light-emitting diode element of Embodiment 1 where the length of an overlapping portion of the conductive layer and the p-side electrode, which was viewed from a direction perpendicular to the rear surface of an n-type semiconductor layer, was varied from 0 μm to 300 μm while the thickness of the conductive layer was fixed.
Figure 7B:
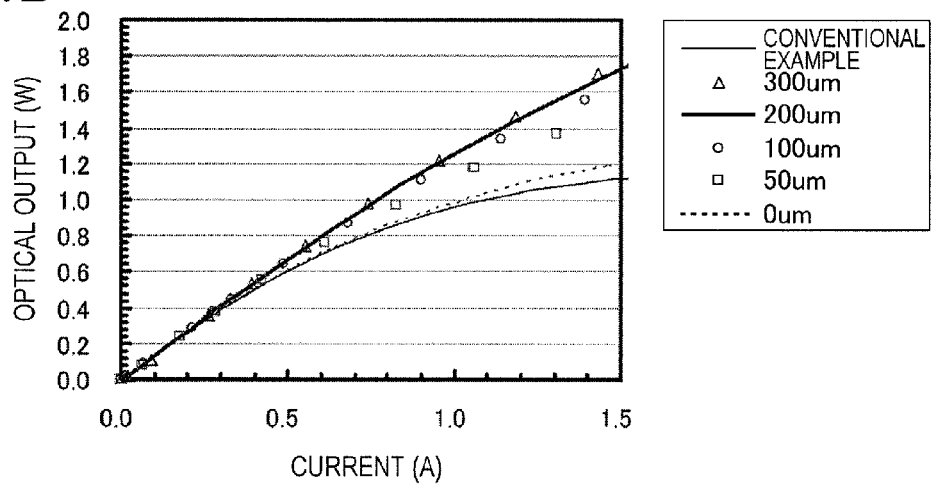
Figure 7C:
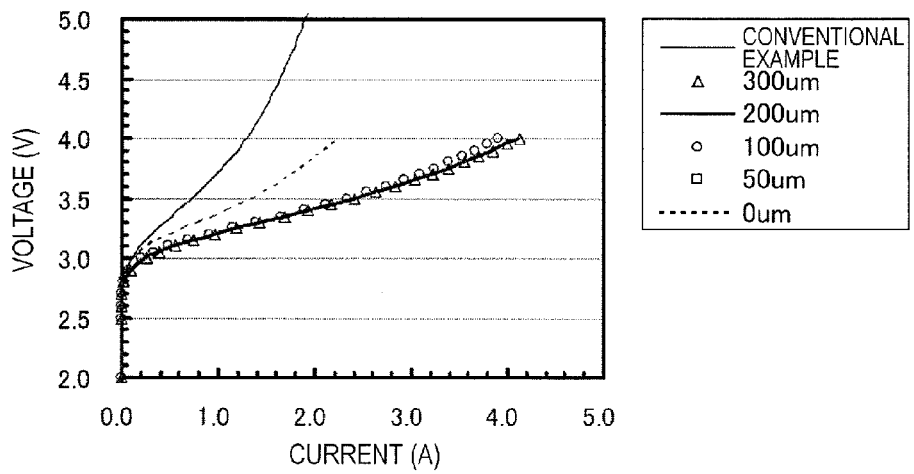

FIGS. 7A to 7C show the results of a simulation with the length of an overlapping portion of the conductive layer 9 and the p-side electrode 5 being varied from 0 μm to 300 μm while the thickness of the conductive layer 9 being fixed. FIG. 7A shows the current dependence of the external quantum efficiency EQE. FIG. 7B shows the current dependence of the optical output. FIG. 7C shows the current dependence of the voltage. It is seen that, when the overlapping portion of the conductive layer 9 and the p-side electrode 5 is about 50 μm, the external quantum efficiency and optical output during flowing of a large electric current greatly improve, and the increase of the voltage can be prevented.

Figure 8A:
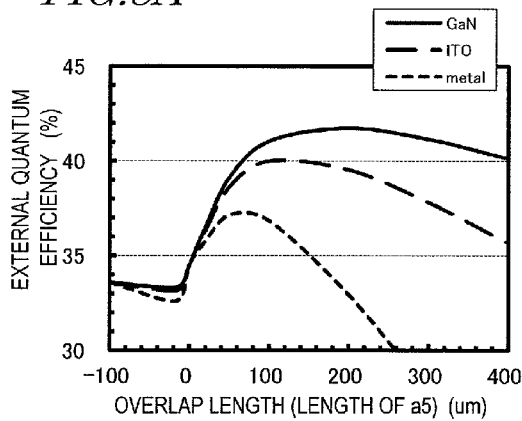
FIGS. 8A to 8E show the light emission characteristics in the operation with a current of 1 A based on a simulation which was carried out under the conditions that GaN, ITO, and a metal were used for the conductive layer, and the length of the overlap of the conductive layer and the p-side electrode 5 (length of a5) was varied.
Figure 8B:
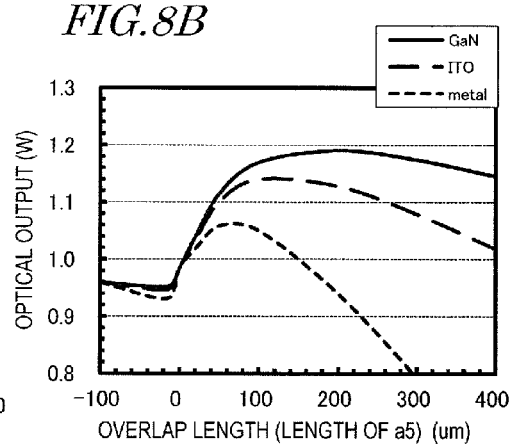
Figure 8C:
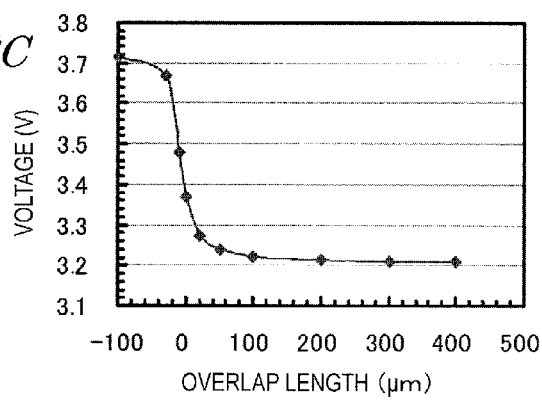
Figure 8D:
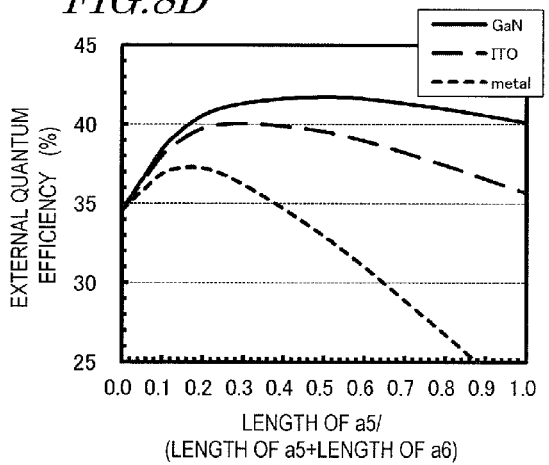
Figure 8E:
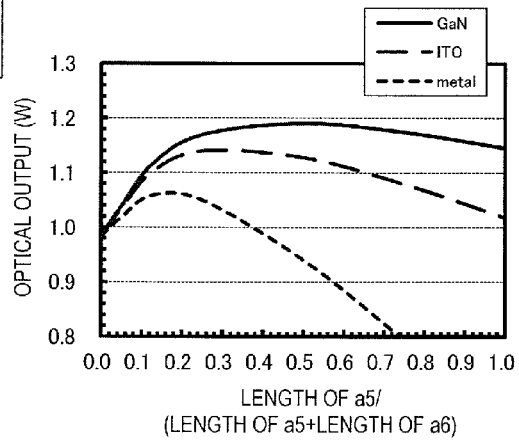

FIGS. 8A to 8E show the light emission characteristics in the operation with a current of 1 A based on a more detailed simulation as to the length of the overlap of the conductive layer 9 and the p-side electrode 5 (length of a5) in addition to the results shown in FIG. 7. In FIGS. 8A to 8C, the horizontal axis represents the length of the overlap (length of a5). In FIG. 8D and FIG. 8E, to provide more normalized representations, the horizontal axis represents the overlap length ratio (a5/(a5+a6)). FIG. 8A and FIG. 8D show the overlap length dependence of the external quantum efficiency (EQE). FIG. 8B and FIG. 8E show the overlap length dependence of the optical output. FIG. 8C shows the overlap length dependence of the voltage.

In FIGS. 8A, 8B, 8D, and 8E, the calculation results for the cases where three different types of materials were used for the conductive layer 9 are shown together. The calculation was carried out on the assumptions that the absorption coefficient of GaN is 1.2 cm$^{-1}$, the absorption coefficient of ITO is 2000 cm$^{-1}$, and the metal completely blocks light. An embodiment which employs a transparent electrode and a metal for the conductive layer will be described in detail in the section of the second embodiment.

Table 1 shown below provides the values of the overlap length (length of a5), the overlap length ratio (a5/(a5+a6)), the series resistance of the light-emitting element, the operation voltage at 1 A, the external quantum efficiency (EQE), and the optical output.

TABLE 1

| Length of a5 | a5/(a5 + a6) | Series Resistance | Operation Voltage at 1 A | EQE [%] | | | Optical Output | | |
|---|---|---|---|---|---|---|---|---|---|
| [μm] | | [ohm] | [V] | GaN | ITO | Metal | GaN | ITO | metal |
| −100 | — | 0.87 | 3.71 | 33.60 | 33.60 | 33.60 | 0.96 | 0.96 | 0.96 |
| −30 | — | 0.79 | 3.67 | 33.32 | 33.15 | 32.65 | 0.95 | 0.95 | 0.93 |
| −10 | — | 0.49 | 3.48 | 33.47 | 33.30 | 32.78 | 0.96 | 0.95 | 0.94 |
| 0 | 0 | 0.34 | 3.37 | 34.52 | 34.52 | 34.52 | 0.98 | 0.98 | 0.98 |
| 20 | 0.05 | 0.23 | 3.27 | 36.51 | 36.33 | 35.78 | 1.04 | 1.03 | 1.02 |
| 50 | 0.125 | 0.21 | 3.24 | 39.13 | 38.63 | 37.15 | 1.11 | 1.10 | 1.06 |
| 100 | 0.25 | 0.21 | 3.22 | 41.05 | 40.00 | 36.84 | 1.17 | 1.14 | 1.05 |
| 200 | 0.5 | 0.21 | 3.21 | 41.73 | 39.53 | 32.94 | 1.19 | 1.13 | 0.94 |
| 300 | 0.75 | 0.21 | 3.21 | 41.15 | 37.81 | 27.80 | 1.17 | 1.08 | 0.79 |
| 400 | 1 | 0.21 | 3.21 | 40.13 | 35.67 | 22.29 | 1.15 | 1.02 | 0.64 |

It is seen from FIG. 8 and Table 1 that, when the configuration of the present disclosure is used, the conductive layer 9 overlaps the p-type conductive layer 5 by a distance of greater than 0 μm irrespective of the material of the conductive layer 9, and as a result, the efficiency and optical output critically improve in a large electric current range, the element resistance decreases, the driving voltage decreases, and excellent characteristics are obtained, as compared with the conventional configuration in which a conductive layer is not provided. However, as the overlap length increases, the external quantum efficiency and optical output reach the maximum values and then decrease. This is because, in the case where the conductive layer 9 is formed of GaN or a transparent conductive material, such as ITO, the light extraction decreases due to light absorption by the conductive layer 9. In the case where the conductive layer 9 is formed of a material which blocks light, such as a metal, the external quantum efficiency and optical output decrease more sharply. From these results, it is seen that the light emission characteristics are improved so long as the overlap of the conductive layer 9 with the p-side electrode 5 is at least greater than 0 μm.

In the case where the conductive layer 9 is formed of a transparent conductive material, a light-emitting diode element which has high external quantum efficiency and high optical output can be realized within the following range:

$$0.125 \leq \frac{a5}{a5 + a6} \leq 0.750$$

In the case where the conductive layer 9 is formed of a metal material, a light-emitting diode element which has high external quantum efficiency and high optical output can be realized within the following range:

$$0.050 \leq \frac{a5}{a5 + a6} \leq 0.250$$

(Embodiment 2)

Figure 15:
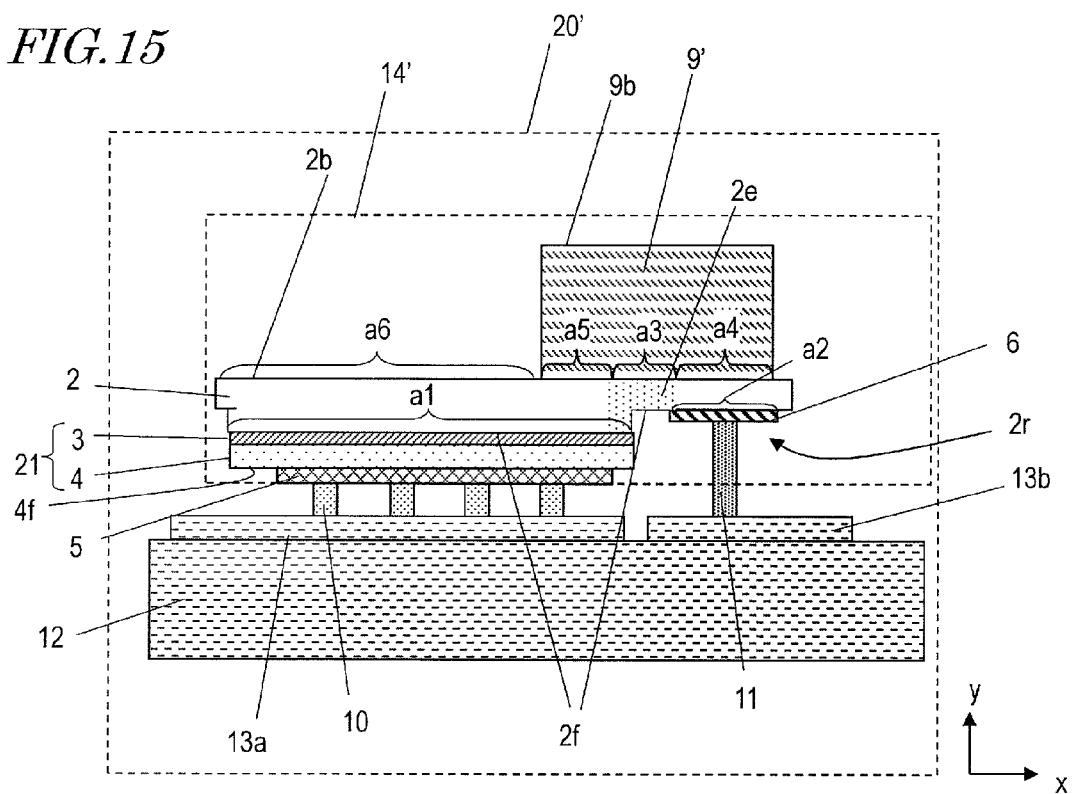
FIG. 15 is a cross-sectional view of a light-emitting diode device of Embodiment 2.

Embodiment 2 of the light-emitting diode device of the present disclosure is described. The light-emitting diode device of the present embodiment is different from Embodiment 1 in that the conductive layer is formed of a transparent conductive material or a conductive material. FIG. 15 is a diagram for illustrating the configuration of the light-emitting diode device 20' of Embodiment 2. Note that components which are identical with those of the light-emitting diode device 20 of Embodiment 1 are denoted by the same reference numerals, and descriptions of those components are herein omitted. The light-emitting diode device 20' of the present embodiment has the same configuration as the light-emitting diode device 20 of Embodiment 1 except for the light-emitting diode element. The light-emitting diode element 14' of the present embodiment has the same configuration as the light-emitting diode element 14 except for the conductive layer.

The conductive layer 9' of the present embodiment is formed of, for example, a transparent conductive material, such as ITO (Indium Tin Oxide), a metal commonly used for manufacture of semiconductor devices, such as gold, silver, copper, titanium, nickel, aluminum, or a conductive material containing solder, indium, or silver.

The light-emitting diode element 14' can be manufactured in the same way as the light-emitting diode element 14 of Embodiment 1. The manufacture process up to the formation of the p-side electrode 5 and the n-side electrode 6 is carried out in the same way as the light-emitting diode element 14 of Embodiment 1.

Next, the light-emitting diode element 14' which is not yet complete is inverted to be mounted to the mounting base 12 in such a manner that the principal surface 2f provided with the p-side electrode 5 and the n-side electrode 6 is directed downwardly and that the n-type GaN substrate is directed upwardly. Then, the n-type GaN substrate is removed by a laser lift-off processing, for example.

Thereafter, a conductive layer 9' is formed of a metal, a conductive material, or a transparent conductive material so as to cover the third region 3a, the fourth region a4, and the fifth region a5 of the n-type semiconductor layer 2. The conductive layer 9' can be formed by an appropriate method selected depending on the used material. When ITO is used, the conductive layer 9' can be formed by a sol-gel method, lamination of a sheet, or sputtering. In case of using a conductive material in which solder, indium, or silver has been mixed, the conductive layer 9 can be formed by softening the material by heating and placing the softened material at a desired position. When the conductive layer 9' is formed of a metal, sputtering, or deposition can be used.

For the thickness of the conductive layer 9', an appropriate value may be selected depending on the used material. The thickness of the conductive layer 9' only need to be set such that the specific resistance is smaller than 0.01 Ω·cm. When ITO is used, the thickness of the conductive layer 9' can be set to an approximately equal value to that of the case where the conductive layer 9 is formed with a GaN layer. When a metal is used, the thickness of the conductive layer 9' may be set to a value which is smaller than that of the GaN layer by two orders of magnitude. In this way, the light-emitting diode device 20' is completed.

According to the present embodiment, a substrate on which the n-type semiconductor layer 2 and the multilayer structure 21 have been formed is removed. Thus, for example, the n-type semiconductor layer 2 and the multilayer structure 21 can be formed on an inexpensive sapphire substrate, and the conductive layer 9' can be formed of an inexpensive conductive material. Therefore, a high-output light-emitting diode element which allows flow of a large electric current can be manufactured at a low cost.

When a transparent conductive material is used as the conductive layer 9', light can also be extracted from a region of the rear surface which is covered with the conductive layer 9'. Thus, the efficiency of extraction of light to the outside can be further improved.

(Other Embodiments)

Hereinafter, other embodiments of the light-emitting diode element and the light-emitting diode device of the present disclosure are described.

Figure 9A:
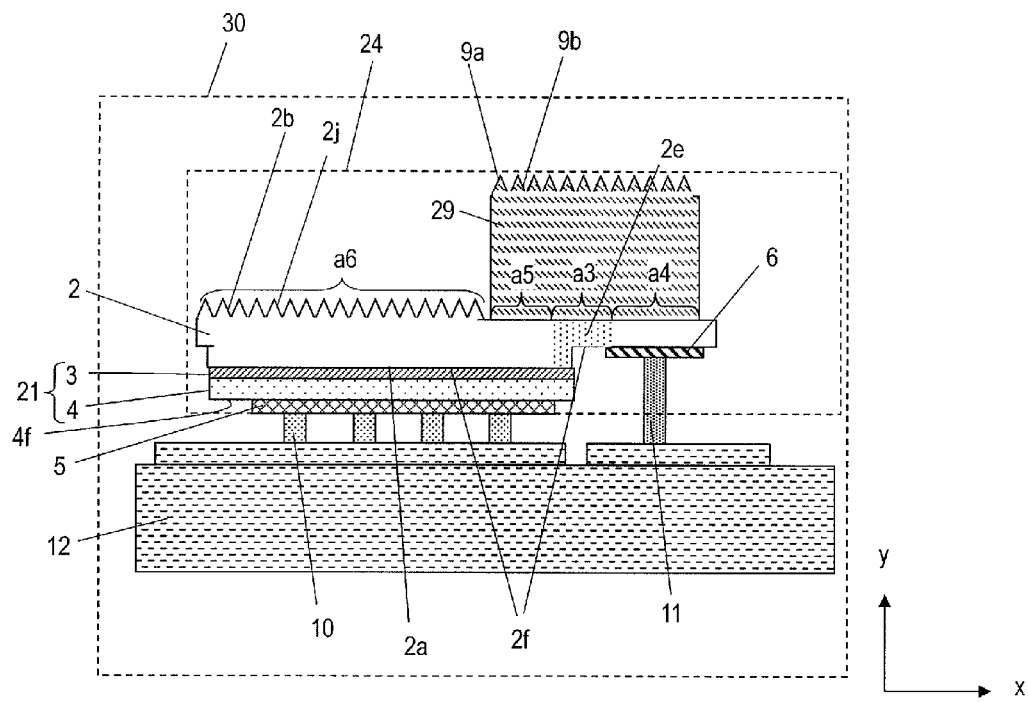
FIG. 9A is a cross-sectional view of a light-emitting diode device according to a variation of Embodiments and 2.
Figure 9B:
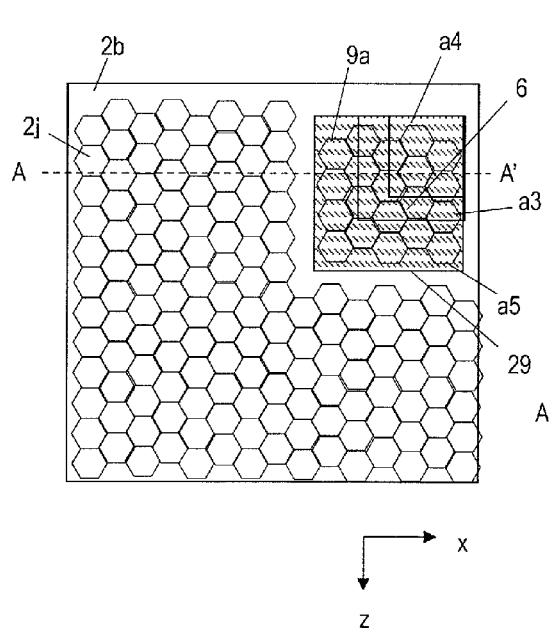
FIGS. 9B and 9C are plan views of the light-emitting diode element according to the variation which is viewed from the rear surface and from the principal surface, respectively.
Figure 9C:
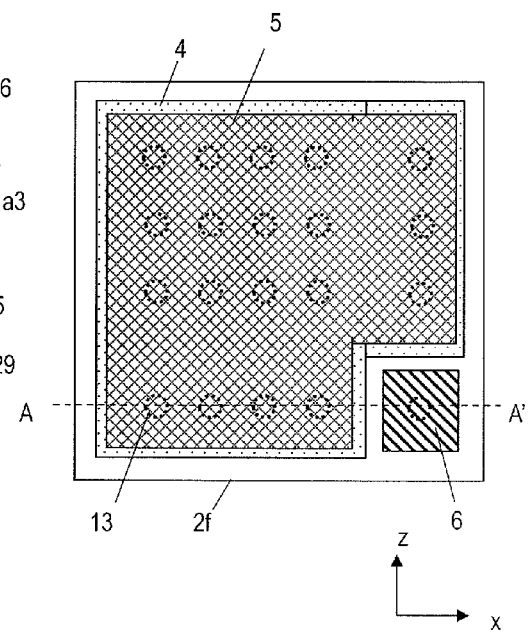

FIG. 9A is a cross-sectional view showing a light-emitting diode element 24 and a light-emitting diode device 30 according to a variation of Embodiment 1 and Embodiment 2. FIG. 9B is a plan view of the light-emitting diode element 24 which is viewed from the rear surface 2b side of the n-type semiconductor layer 2. FIG. 9C is a plan view of the light-emitting diode element 24 which is viewed from the principal surface 2f side of the n-type semiconductor layer 2. In these diagrams, components which are equivalent to those of Embodiments 1 and 2 are denoted by the same reference numerals, and descriptions of those components are herein omitted.

The light-emitting diode device 30 of this variation has the same configuration as that of the light-emitting diode device 20, 20' of Embodiment 1 or Embodiment 2 except for the light-emitting diode element. The light-emitting diode element 24 of this variation has the same configuration as that of the light-emitting diode element 14, 14' of Embodiment 1 or Embodiment 2 except that the rear surface 2b of the n-type semiconductor layer 2 has an uneven structure 2j in the sixth region a6 and that a surface 9b of a conductive layer 29 which is opposite to the side where the n-type semiconductor layer 2 is provided has an uneven structure 9a. The conductive layer 29 of this inventive example has the same configuration as that of the conductive layer 9, 9' of Embodiment 1 or Embodiment 2 except that the uneven structure 9a is provided.

The step height in the uneven structures 2j, 9a is not more than 1 μm and not more than 5 μm. The step height is smaller than the thicknesses of the conductive layer 29 and the n-type semiconductor layer 2. The uneven structures 2j, 9a are formed on the sixth region a6 of the rear surface 2b of the n-type semiconductor layer 2 and on the surface 9b of the conductive layer 29 by an etching method. Only either one of the uneven structure 2j or the uneven structure 9a may be provided. The unit structure of the uneven structure may have a desired shape on the light extraction side, which is suitable to extraction of light, such as a hemispherical protrusion, generally triangular pyramid, or generally hexagonal pyramid.

According to the light-emitting diode element 24 and the light-emitting diode device 30 of this variation, the efficiency of light extraction can be improved by the uneven structures.

Figure 10A:
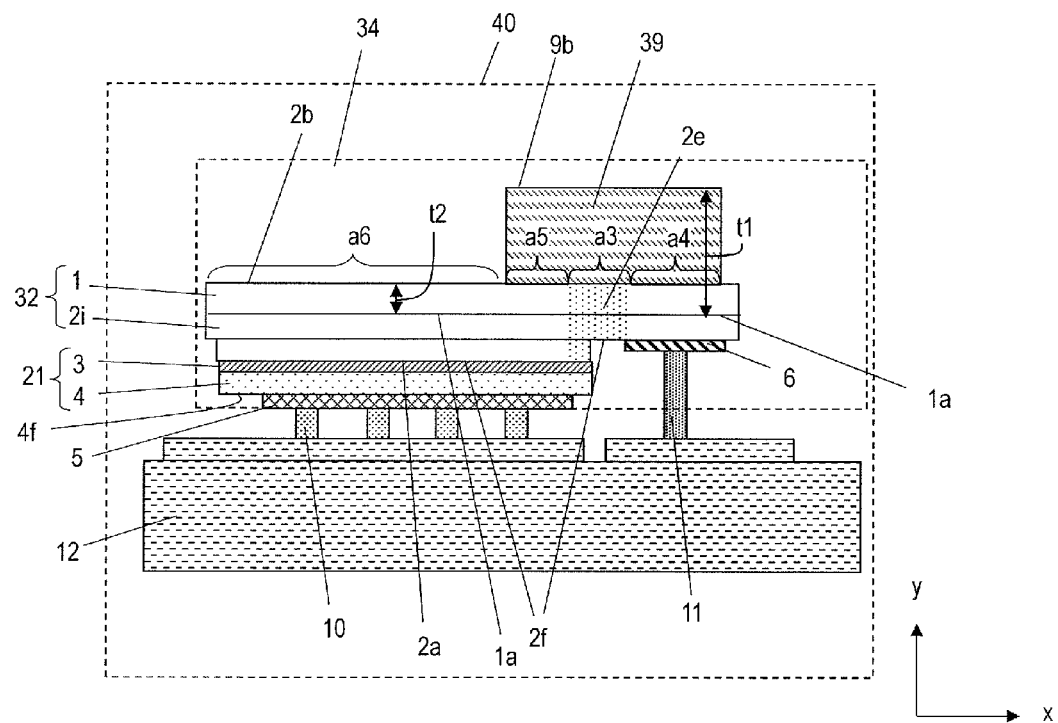
FIG. 10A is a cross-sectional view of a light-emitting diode device according to another variation of Embodiments 1 and 2.
Figure 10B:
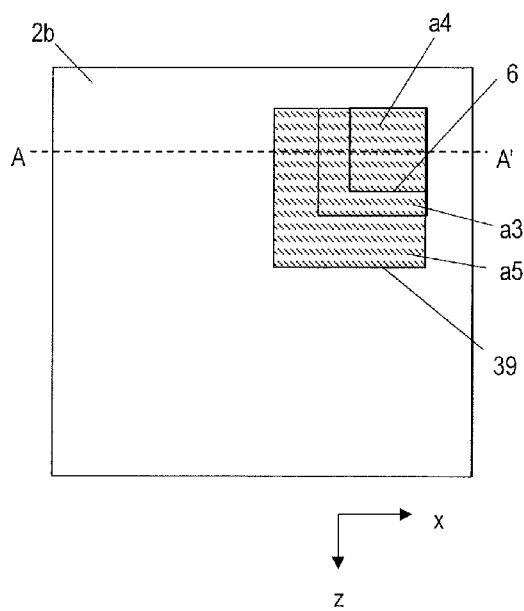
FIGS. 10B and 10C are plan views of the light-emitting diode element according to another variation which is viewed from the rear surface and from the principal surface, respectively.
Figure 10C:
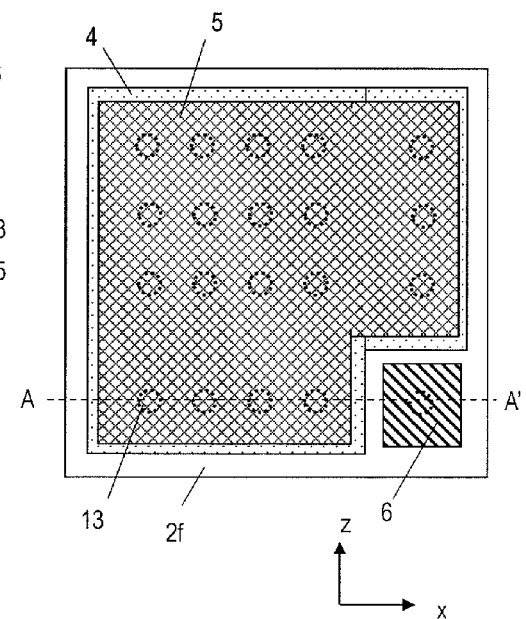

FIG. 10A is a cross-sectional view showing a light-emitting diode element 34 and a light-emitting diode device according to another variation of Embodiment 1 and Embodiment 2. FIG. 10B is a plan view of the light-emitting diode element 34 which is viewed from the rear surface 2b side of the n-type semiconductor layer 2. FIG. 10C is a plan view of the light-emitting diode element 34 which is viewed from the principal surface 2f side of the n-type semiconductor layer 2. In these diagrams, components which are equivalent to those of Embodiments 1 and 2 are denoted by the same reference numerals, and descriptions of those components are herein omitted.

The light-emitting diode device 40 of this variation has the same configuration as that of the light-emitting diode device 20, 20' of Embodiment 1 or Embodiment 2 except for the light-emitting diode element. The light-emitting diode element 34 of this variation has the same configuration as that of the light-emitting diode element 14, 14' of Embodiment 1 or Embodiment 2 except for the n-type semiconductor layer. An n-type semiconductor layer 32 of this inventive example includes an epitaxial growth layer 2i of the first conductivity type and a semiconductor substrate 1 of the first conductivity type.

The n-type semiconductor layer 32 is obtained by removing the n-type substrate 1 from the rear surface 2b by etching or laser processing such that part of the n-type substrate 1 is left unremoved in the manufacturing process of the light-emitting diode element 34. Since the n-type substrate 1 is left unremoved, the strength of the entire n-type semiconductor layer 32 can be maintained even when the thickness of the epitaxial growth layer 2i is reduced. Thus, there are an advantage that the thickness of the epitaxial growth layer 2i is reduced so that the growth time can be reduced, and an advantage that the strength of a chip or wafer during manufacture of the light-emitting diode device 20 is maintained so as to improve handleability.

In this variation, a conductive layer 39 may be formed of n-type GaN, SiC, or a semiconductor containing Si as described in Embodiment 1, or may be formed of a transparent conductive material, a metal, or a conductive material as described in Embodiment 2. The conductive layer 39 may be formed with the n-type substrate 1. In this case, the n-type substrate 1 of the n-type semiconductor layer 32 and the conductive layer 39 are integrally formed by etching or laser processing. When the rear surface 2b side of the n-type semiconductor layer 32 and the conductive layer 39 are integrally formed in this way, the third region a3, the fourth region a4, and the fifth region a5 are not present on the actual boundary surface but are present on an imaginary surface obtained by extending the other rear surface region than the regions a3, a4, and a5.

As shown in FIG. 10A, the total thickness t1 of the n-type substrate 1 of the n-type semiconductor layer 32 and the conductive layer 39, which are integrally formed in the third region a3, the fourth region a4, and the fifth region a5, is greater than the thickness t2 of the n-type substrate 1 in the sixth region a6. Thus, as previously described in Embodiment 1, the cross-sectional area of the pathway of an electric current flowing from the active layer 3 to the n-side electrode 6 can be increased, and the effects which have previously been described in Embodiment 1 can be obtained.

Further, in this variation, as previously described with reference to FIG. 9, the uneven structures 2j, 9a may be provided in the conductive layer 39 and the n-type semiconductor layer 32. In this case, due to the uneven structures 2j, 9a, the conductive layer 39 and the n-type semiconductor layer 32 have smaller thickness portions. The minimum value t1' of the total thickness of the conductive layer 39 and the n-type substrate 1, which are integrally formed in the third region a3, the fourth region a4, and the fifth region a5, is greater than the minimum value t2' of the thickness of the n-type substrate 1 in the sixth region a6. The average value of the total thickness of the conductive layer 39 and the n-type substrate 1 in the third region a3, the fourth region a4, and the fifth region a5 may be greater than the average value of the thickness of the n-type substrate 1 in the sixth region a6. As a result, as previously described in Embodiment 1, the cross-sectional area of the pathway of an electric current flowing from the active layer 3 to the n-side electrode 6 can be increased, and the effects which have previously been described in Embodiment 1 can be obtained. A conventional light-emitting diode element which has an uneven structure in the rear surface does not include a component corresponding to the conductive layer 39 and has a remaining substrate which has a uniform thickness. Therefore, the conventional light-emitting diode element does not satisfy the above-described thickness relationship. Further, the substrate which has a large thickness remains over the entire structure, and therefore, absorption of light by the substrate constitutes a problem.

Figure 11A:
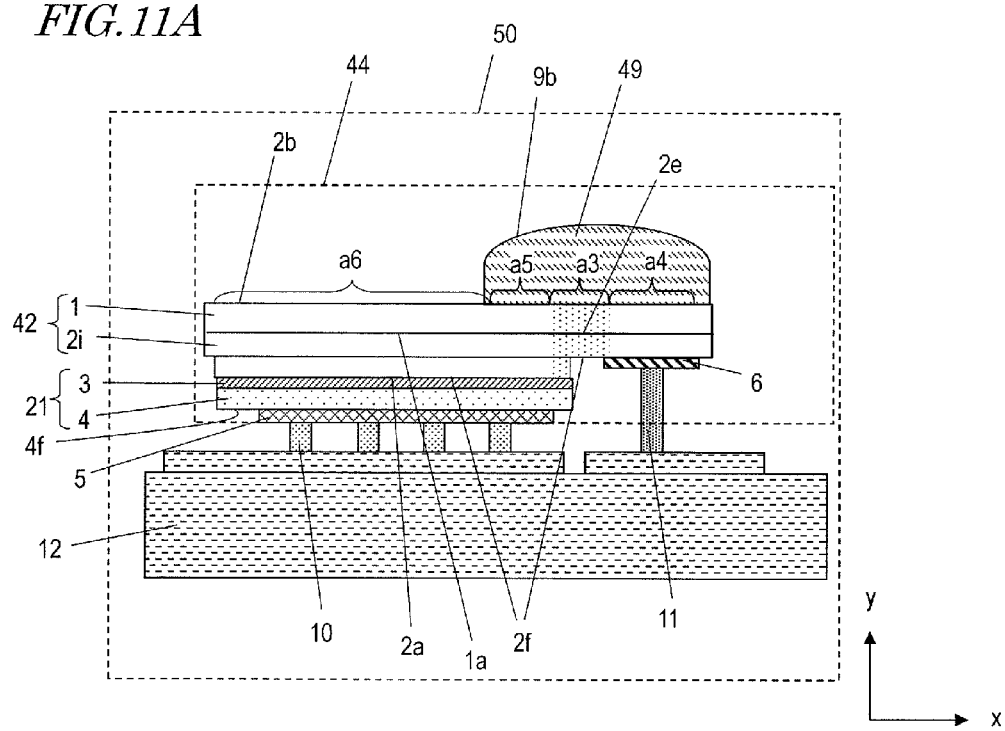
FIG. 11A is a cross-sectional view of a light-emitting diode device according to still another variation of Embodiments 1 and 2.
Figure 11B:
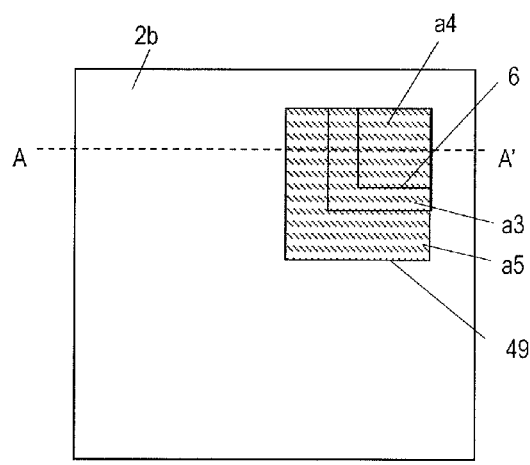
FIGS. 11B and 11C are plan views of the light-emitting diode element according to still another variation which is viewed from the rear surface and from the principal surface, respectively.
Figure 11C:
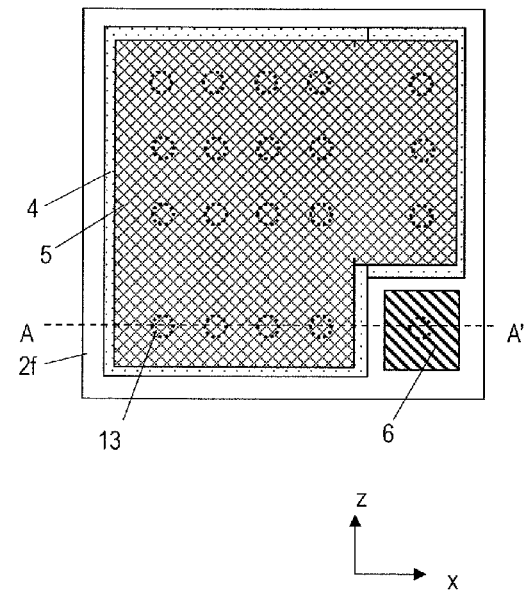

FIG. 11A is a cross-sectional view showing a light-emitting diode element 44 and a light-emitting diode device 50 according to still another variation of Embodiment 1 and Embodiment 2. FIG. 11B is a plan view of the light-emitting diode element 44 which is viewed from the rear surface 2b side of the n-type semiconductor layer 42. FIG. 11C is a plan view of the light-emitting diode element 44 which is viewed from the principal surface 2f side of the n-type semiconductor layer 42. In these diagrams, components which are equivalent to those of Embodiments 1 and 2 are denoted by the same reference numerals, and descriptions of those components are herein omitted. The light-emitting diode device 50 of this variation has the same configuration as that of the light-emitting diode device 20, 20', 30, or 40 of Embodiment 1, 2 or the previously-described variation except for the light-emitting diode element. The light-emitting diode element 44 of this variation has the same configuration as that of the light-emitting diode element 14, 14', 24, or 34 of Embodiment 1, 2 or the previously-described variation except for the conductive layer. The n-type semiconductor layer 42 of this variation has the same configuration as that of the n-type semiconductor layer 2, 32 of Embodiment 1, 2 or any of the previously-described variations.

The conductive layer 49 of this variation has a different shape from that of the conductive layers 9, 9' of Embodiment 1 and Embodiment 2. Specifically, the surface 9b of the conductive layer 49 which is opposite to the side where the n-type semiconductor layer 42 is provided is formed by a convex surface. The conductive layer 49 may be formed of the same material as that of the conductive layer 9, 9', 29, 39 of Embodiment 1, 2 or any of the previously-described variations. When the conductive layer 49 is formed of a transparent conductive material, the amount of light extracted from the conductive layer 49 can be increased by the convex surface. When the conductive layer 49 is formed of a non-transparent material, there is an advantage that light outgoing from the light-emitting diode element 44 is less likely to affect the radiation pattern.

In this variation, the conductive layer 49 has a convex surface, although it may have the surface 9b of a different shape, such as a projecting triangular pyramid surface, a projecting hexagonal pyramid surface, etc.

Figure 12A:
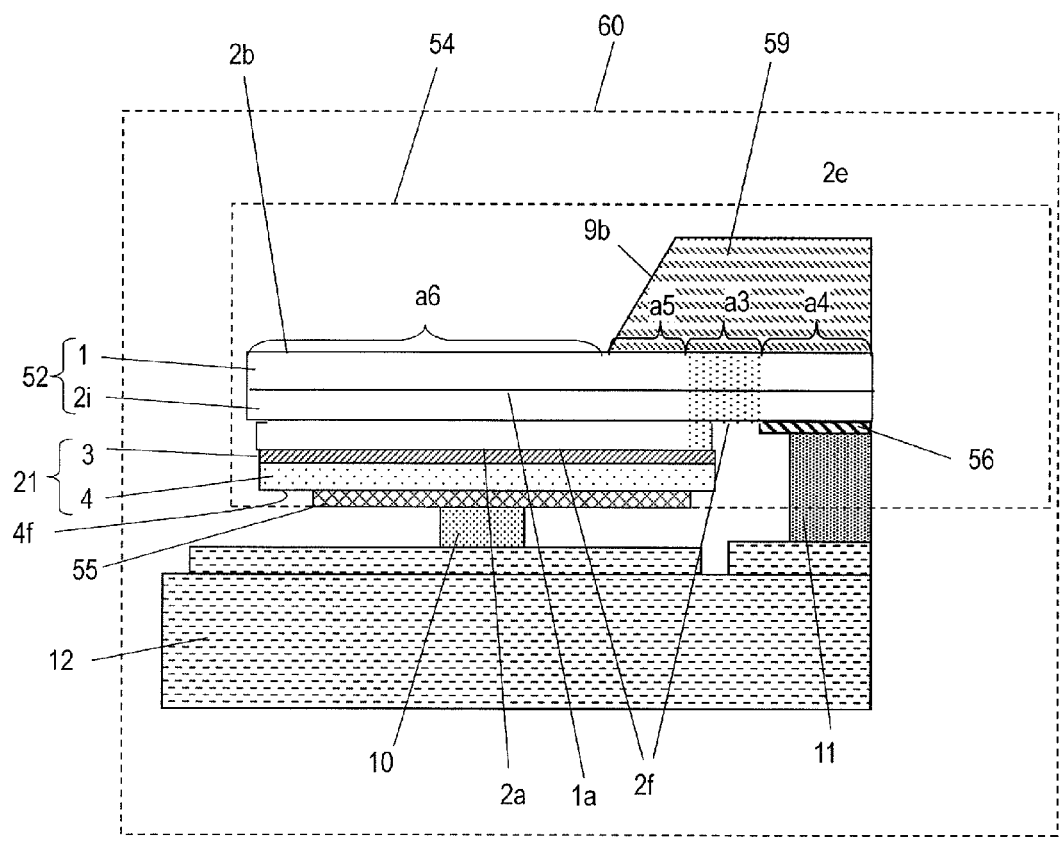
FIG. 12A is a cross-sectional view of a light-emitting diode device according to still another variation of Embodiments 1 and 2.
Figure 12B:
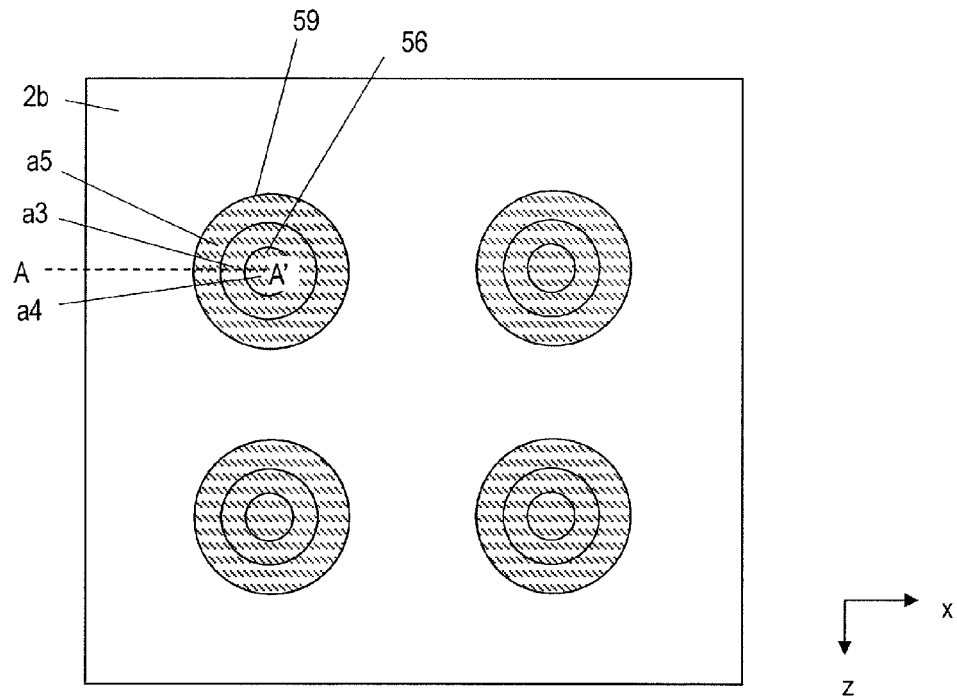
FIG. 12B is a plan view of a light-emitting diode element according to still another variation of Embodiments 1 and 2, which is viewed from the rear surface.
Figure 12C:
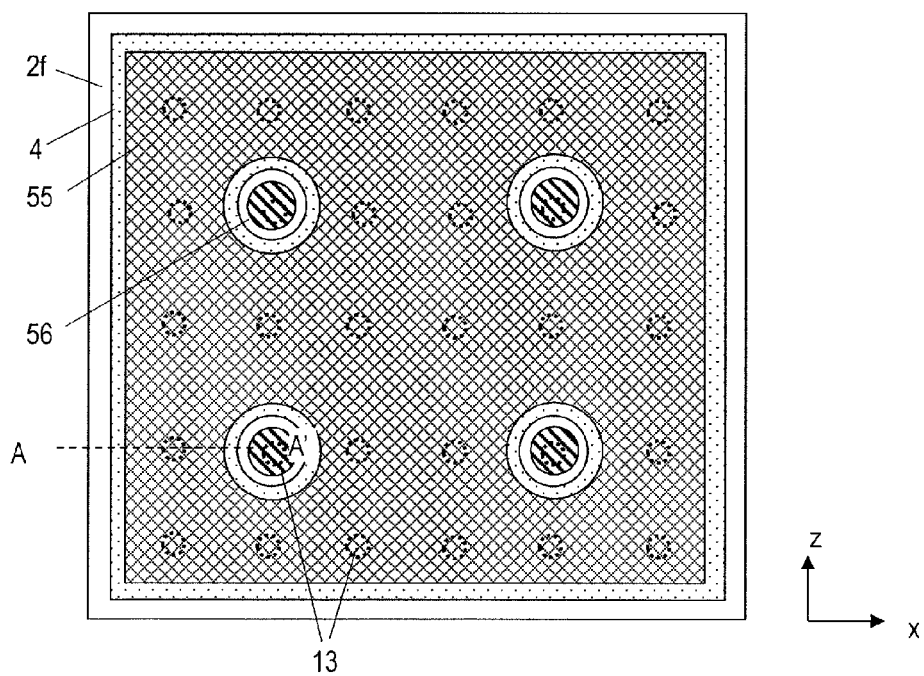
FIG. 12C is a plan view of a light-emitting diode element according to still another variation of Embodiments 1 and 2, which is viewed from the principal surface.
Figure 13A:
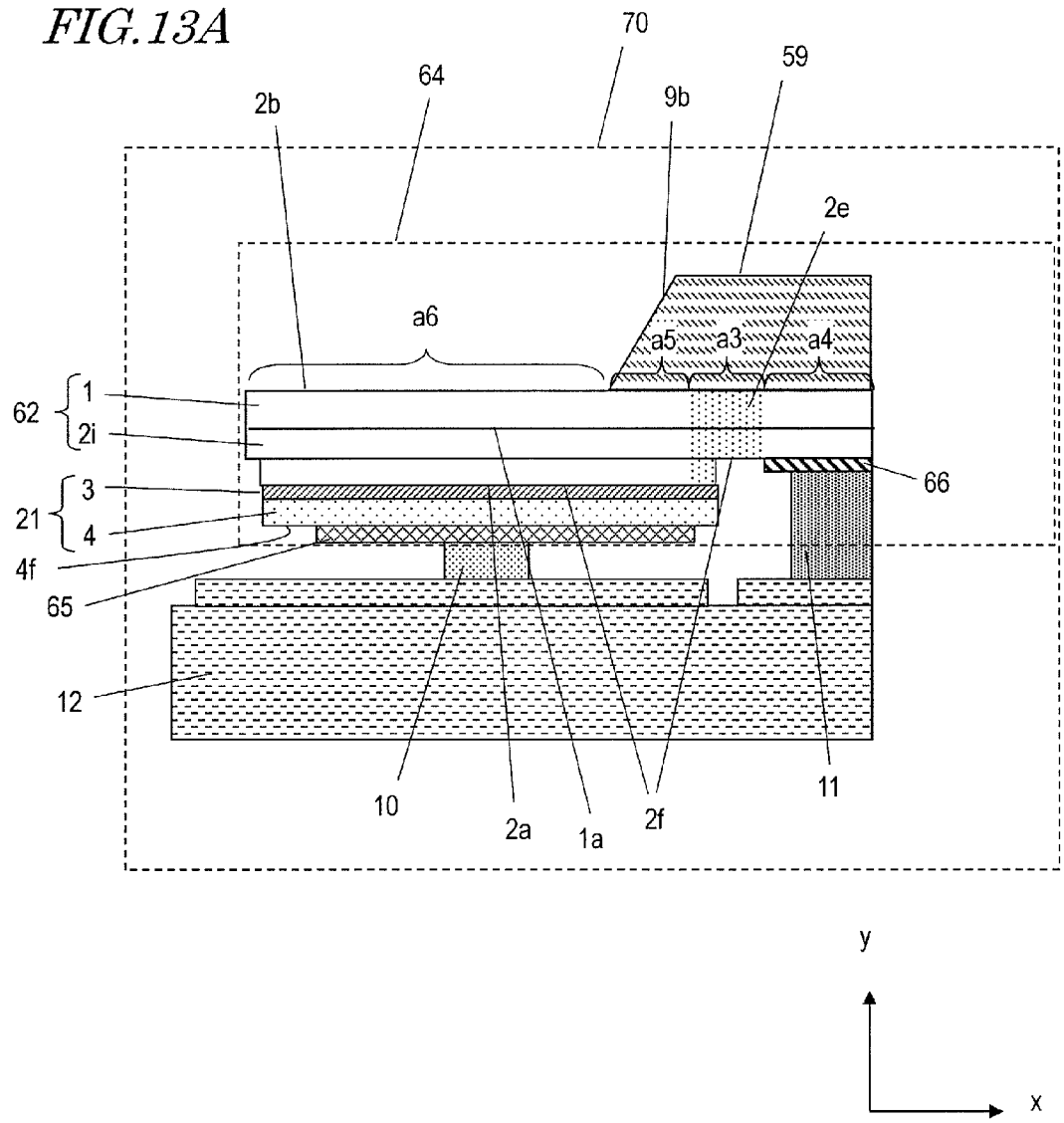
FIG. 13A is a cross-sectional view of a light-emitting diode device according to still another variation of Embodiments 1 and 2.
Figure 13B:
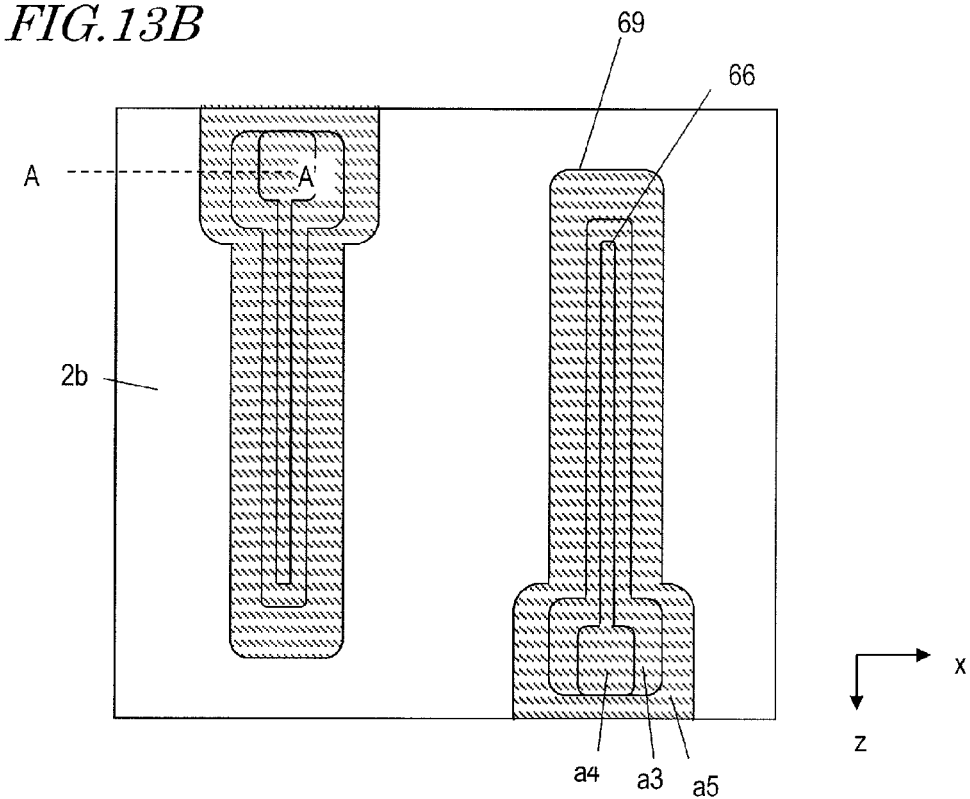
FIG. 13B is a plan view of a light-emitting diode element according to still another variation of Embodiments 1 and 2, which is viewed from the rear surface.
Figure 13C:
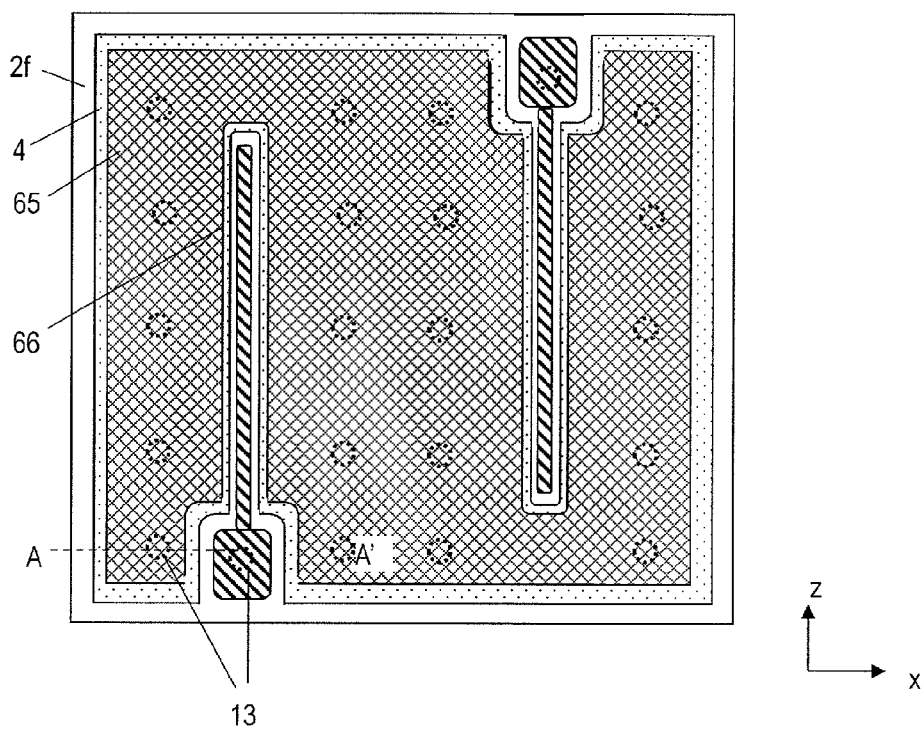
FIG. 13C is a plan view of a light-emitting diode element according to still another variation of Embodiments 1 and 2, which is viewed from the principal surface.

FIG. 12A is a cross-sectional view showing a light-emitting diode element 54 and a light-emitting diode device 60 according to still another variation of Embodiment 1 and Embodiment 2. FIG. 12B is a plan view of the light-emitting diode element 54 which is viewed from the rear surface 2b side of the n-type semiconductor layer 52. FIG. 12C is a plan view of the light-emitting diode element 54 which is viewed from the principal surface 2f side of the n-type semiconductor layer 52. FIG. 13A is a cross-sectional view showing a light-emitting diode element 64 and a light-emitting diode device 70 according to still another variation. FIG. 13B is a plan view of the light-emitting diode element 64 which is viewed from the rear surface 2b side of the n-type semiconductor layer 62. FIG. 13C is a plan view of the light-emitting diode element 64 which is viewed from the principal surface 2f side of the n-type semiconductor layer 62. In these diagrams, components which are equivalent to those of Embodiment 1, 2 or any of the previously-described variations are denoted by the same reference numerals, and descriptions of those components are herein omitted.

The light-emitting diode devices 60, 70 of these variations have the same configuration as that of the light-emitting diode device 20, 20', 30, 40, or 50 of Embodiment 1, or any of the previously-described variations except for the light-emitting diode element. The light-emitting diode elements 54, 64 of these variations have the same configuration as that of the light-emitting diode element 14, 14', 24, 34, or 44 of Embodiment 1, 2 or any of the previously-described variations except for the shapes of the n-side electrode and p-side electrode. The n-type semiconductor layers 52, 62 and the conductive layers 59, 69 of these variations have the same configurations as those of the n-type semiconductor layer and the conductive layer of Embodiment 1, 2 or any of the previously-described variations.

The light-emitting diode element 54 shown in FIG. 12A to FIG. 12C includes four n-side electrodes 56 each having a circular shape when viewed from the principal surface 2f. The p-side electrode 55 is arranged so as to surround the n-side electrodes 56 with a predetermined separation from the perimeter of the n-side electrodes 56 and cover the entire principal surface 2f.

As shown in FIG. 12B, in the rear surface 2b of the n-type semiconductor layer 52, the fourth region a4 which has an equal shape to that of the n-side electrode 56 is arranged at a position so as to overlap each of the n-side electrodes 56. The third region a3 lying between the p-side electrode and the n-side electrodes 56 has a ring shape which surrounds the fourth region a4 and is provided outside the fourth region a4. The fifth region a5, which overlaps part of the p-side electrode 55, has a ring shape which surrounds the third region a3 and is provided outside the third region a3. The conductive layer 59 is positioned over the fourth region a4, the third region a3, and the fifth region a5. As shown in FIG. 12B, in this case, the boundary between the third region a3 and the fifth region a5 is a circle. The width of the fifth region a5 is defined in a direction perpendicular to a tangent of the circle, i.e., the radial direction of the circle, as indicated by the arrow. Light produced in the active layer 3 of the light-emitting diode element 54 goes out from a portion of the rear surface 2b which surrounds the conductive layer 9.

The light-emitting diode element 64 shown in FIG. 13A to FIG. 13C includes two n-side electrodes 66 which include portions that have a stripe shape when viewed from the principal surface 2f. The p-side electrode 65 is arranged so as to surround the n-side electrodes 66 with a predetermined separation from the perimeter of the n-side electrodes 66 and cover the generally entire principal surface 2f.

The conductive layer 69 provided on the rear surface 2b of the n-type semiconductor layer 62 is also arranged so as to cover the fourth region a4 that is arranged at a position so as to overlap the n-side electrodes 66 when viewed from the rear surface 2b, the third region a3 that surrounds the fourth region a4, and the fifth region a5 that surrounds the third region a3.

According to the light-emitting diode elements and the light-emitting diode devices of these variations, a plurality of n-side electrodes 56, 66 are included and can be dispersedly arranged over the principal surface 2f. Therefore, even when the chip area is increased, it is possible to cause a large electric current to uniformly flow across the entire chip. The shape, number, and arranged position of the n-side electrodes 56, 66 are not limited to these variations but can be variously modified.

Figure 14A:
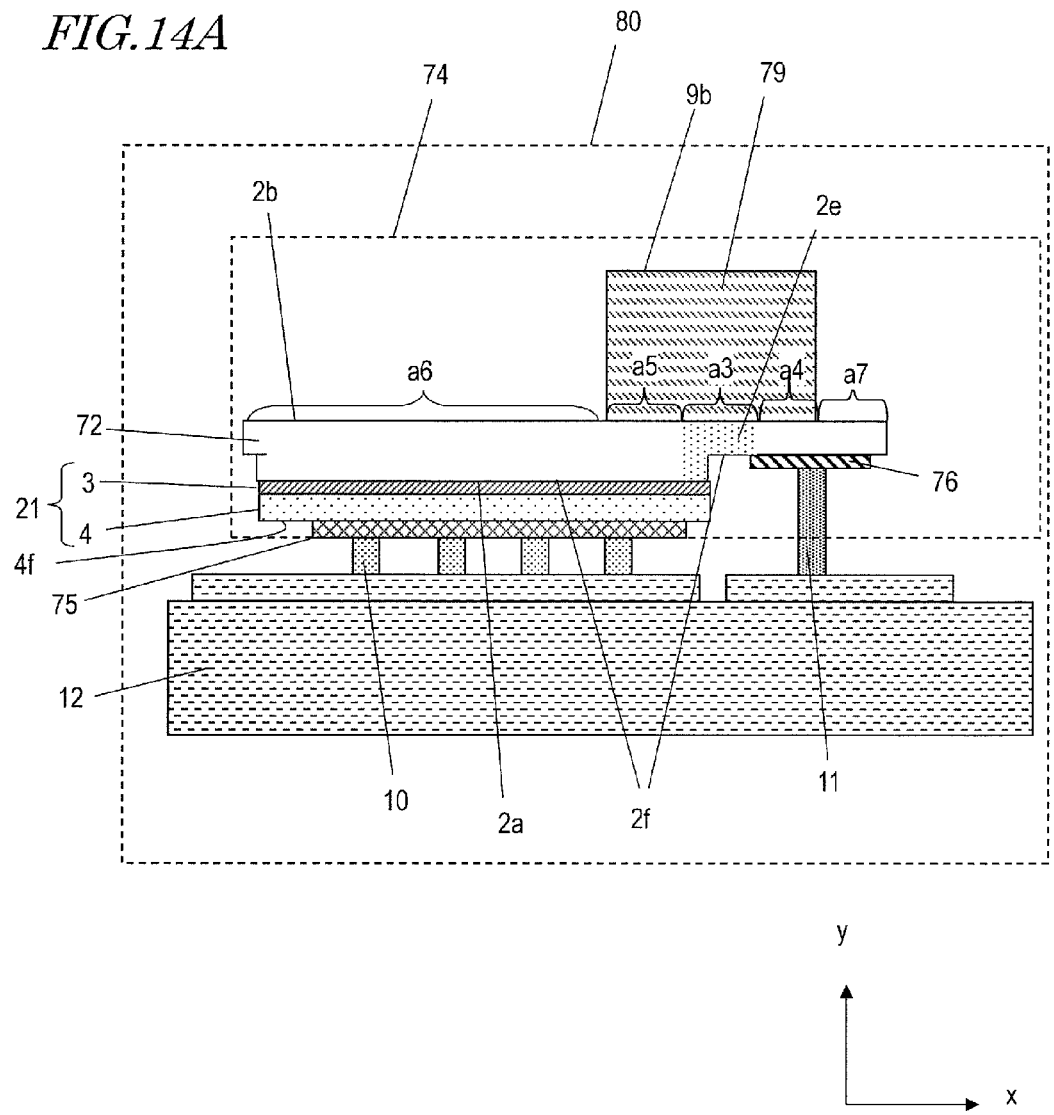
FIG. 14A is a cross-sectional view of a light-emitting diode device according to still another variation of Embodiments 1 and 2.
Figure 14B:
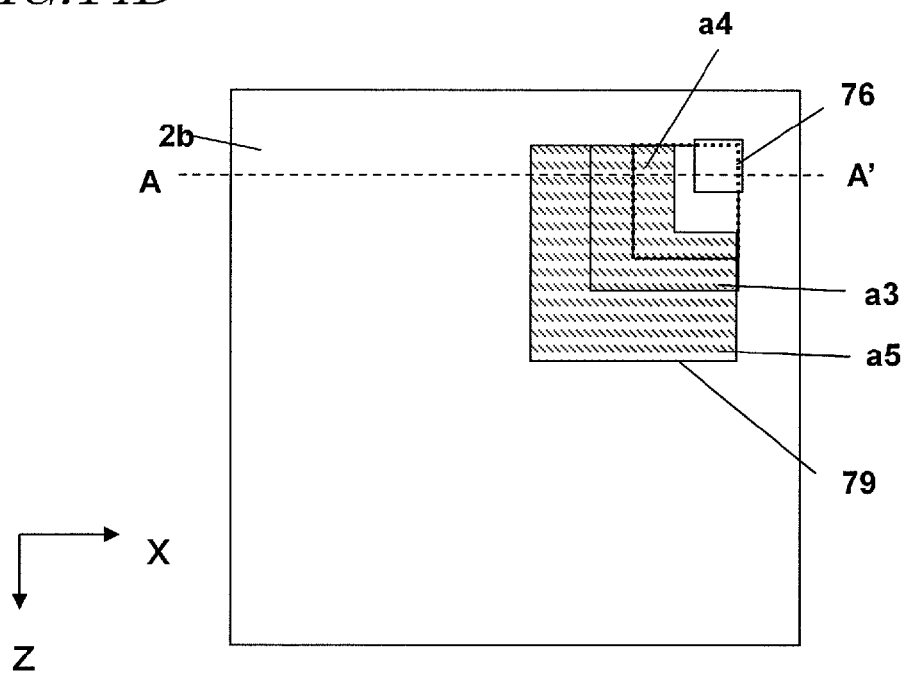
FIG. 14B is a plan view of a light-emitting diode element according to still another variation of Embodiments 1 and 2, which is viewed from the rear surface.
Figure 14C:
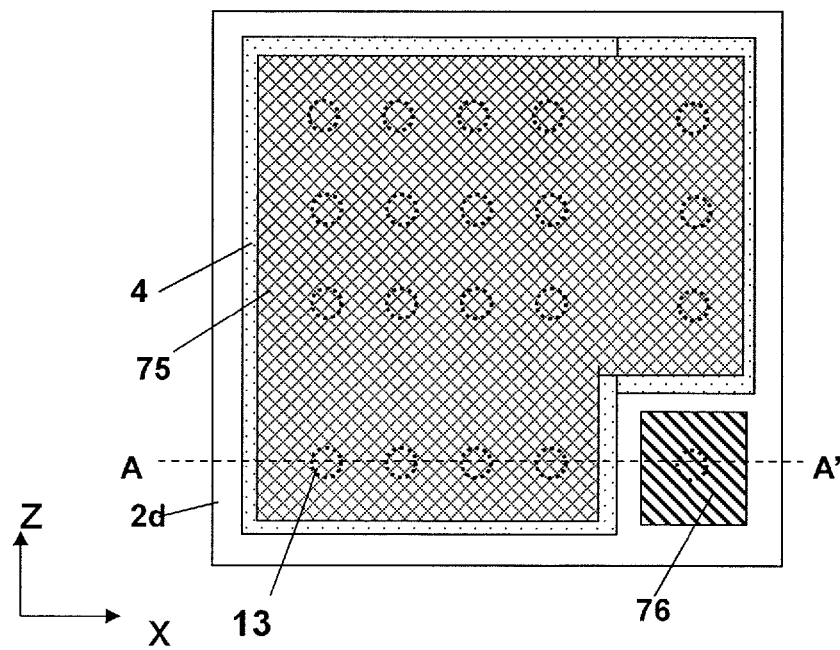
FIG. 14C is a plan view of a light-emitting diode element according to still another variation of Embodiments 1 and 2, which is viewed from the principal surface.

FIG. 14A is a cross-sectional view showing a light-emitting diode element 74 and a light-emitting diode device 80 according to still another variation of Embodiment 1 and Embodiment 2. FIG. 14B is a plan view of the light-emitting diode element 74 which is viewed from the rear surface 2b side of the n-type semiconductor layer 72. FIG. 14C is a plan view of the light-emitting diode element 74 which is viewed from the principal surface 2f side of the n-type semiconductor layer 72. In these diagrams, components which are equivalent to those of Embodiment 1, 2 or any of the previously-described variations are denoted by the same reference numerals.

The light-emitting diode device 80 of this variation has the same configuration as that of the light-emitting diode device 20, 20', 30, 40, or 50 of Embodiment 1, 2 or any of the previously-described variations except for the light-emitting diode element 74. The light-emitting diode element 74 of this variation has the same configuration as that of the light-emitting diode element of Embodiment 1, or any of the previously-described variations except for the shape of the conductive layer. The n-type semiconductor layer 72, n-side electrode 76, and p-side electrode 75 of this variation has the same configurations as those of the n-type semiconductor layer, n-side electrode, and p-side electrode of Embodiment 1, 2 or any of the previously-described variations.

When viewed from the rear surface 2b, the conductive layer 79 of this variation does not completely overlap the n-side electrode 76. Of a portion of the rear surface 2b overlapping with the n-side electrode 76, the seventh region a7 is not provided with the conductive layer 79. Even when such a conductive layer 79 is provided, the conductive layer 79 entirely covers the third region a3 that is positioned over the portion 2e of the n-type semiconductor layer 72 lying between the n-side electrode 76 and the p-side electrode 75 and partially covers a portion of the n-type semiconductor layer 72 on which the n-side electrode 76 is provided and a portion of the n-type semiconductor layer 72 on which the p-side electrode 75 is provided. Thus, the cross-sectional of the pathway of an electric current flowing from the active layer 3 to the n-side electrode 76 can be increased, and the effects which have previously been described in Embodiment 1 can be obtained. Further, according to this variation, even when the conductive layer 79 is formed of a non-transparent material, light which is produced in the active layer 3 and repeatedly reflected inside the n-type semiconductor layer 72 is allowed to outgo from the seventh region a7 of the rear surface 2b of the n-type semiconductor layer 72, which is opposite to the sixth region a6 relative to the conductive layer 79. Therefore, light outgoing from the rear surface 2b becomes more uniform.

In the foregoing sections, the present disclosure has been described as Embodiments 1, 2 and other embodiments including a variety of variations, although the present disclosure may be carried out in the form of an appropriate combination of two or more of these embodiments and variations.

The above embodiments have been described with examples of a GaN-based semiconductor as the semiconductor, although the present disclosure can be suitably employed for light-emitting diode elements and light-emitting diode devices which are formed with other types of semiconductors than the GaN-based semiconductor. In the above-described embodiments, the light-emitting diode element is configured such that light is emitted from the n-type semiconductor layer, although the conductivity types of the respective semiconductor layers may be reversed with each other. Specifically, the n-type semiconductor layer may be positioned on the mounting base side so that light is emitted from the p-type semiconductor layer.

As described hereinabove, according to the light-emitting diode element and the light-emitting diode device disclosed in the present application, a conductive layer decreases the current density in a portion of the n-type semiconductor layer around the n-side electrode. Therefore, generation of heat is reduced, and increase of the resistance of the n-type conductive layer due to heat can be prevented, so that it is possible to allow a large electric current to flow through the element. Further, decrease of the light emission efficiency which would be caused by the increase of the temperature of the active layer can be prevented.

Further, due to the conductive layer, the cross-sectional of the pathway of an electric current flowing from the active layer to the n-side electrode can be increased. Thus, by decreasing the thickness of the n-type semiconductor layer, light produced in the active layer is poorly absorbed by the n-type conductive layer. In this way, the light extraction efficiency can be improved. Further, the n-side electrode and the p-side electrode are provided on the principal surface, and these electrodes and the mounting base are connected via the bumps. Therefore, there is no concern about coming off of the wire which would occur in the case of wire bonding mounting, and the reliability in mounting can be improved.

As described above, according to the embodiments of the present disclosure, even in the case of non-polar plane growth where the impurity concentration of the n-type semiconductor layer is low, generation of heat can be prevented by providing a conductive layer, so that the output can be improved.

The light-emitting diode elements and the light-emitting diode devices disclosed in the present application are suitably employed as light sources for display devices, lighting devices, LCD backlights, flash lamps, and headlamps for vehicles.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:
1. A light-emitting diode element, comprising:
  a first semiconductor layer of a first conductivity type which has a principal surface and a rear surface;
  a second semiconductor layer of a second conductivity type which is provided in a first region of the principal surface of the first semiconductor layer;
  an active layer interposed between the first semiconductor layer and the second semiconductor layer;
  a first electrode provided on a surface of the second semiconductor layer;
  the first semiconductor layer is formed on the active layer;

a second electrode provided in a second region of the principal surface of the first semiconductor layer; and a conductive layer that is arranged such that, in the rear surface of the first semiconductor layer, when viewed from a direction perpendicular to the rear surface, the conductive layer covers a third region lying between the first electrode and the second electrode, a fourth region which is adjacent to the third region and which overlaps at least part of the second electrode, and a fifth region which is adjacent to the third region and which overlaps part of the first electrode, wherein the conductive layer is in contact with the first semiconductor layer, the first semiconductor layer includes, in the rear surface of the first semiconductor layer, a sixth region which is not covered with the conductive layer and which overlaps another part of the first electrode when viewed from a direction perpendicular to the rear surface, and the first semiconductor layer of the first conductivity type is not provided with an electrode penetrating between the principal surface and the rear surface.

2. The light-emitting diode element of claim 1, wherein the conductive layer is formed of a metal, and
the following relationship is satisfied:

$$0.050 \leq \frac{a5}{a5+a6} \leq 0.250$$

where a5 is a width of the fifth region, and a6 is a width of the sixth region.

3. The light-emitting diode element of claim 1, wherein the conductive layer is formed of a conductive transparent material, and
the following relationship is satisfied:

$$0.125 \leq \frac{a5}{a5+a6} \leq 0.750$$

where a5 is a width of the fifth region, and a6 is a width of the sixth region.

4. The light-emitting diode element of claim 1, wherein a thickness of the first semiconductor layer of the first conductivity type is not more than 20 µm.

5. The light-emitting diode element of claim 1, wherein a maximum thickness of the conductive layer is not less than 4 µm and not more than 100 µm.

6. The light-emitting diode element of claim 1, wherein the first semiconductor layer has an uneven structure provided in the sixth region of the rear surface.

7. The light-emitting diode element of claim 1, wherein the conductive layer has an uneven structure on a front surface thereof.

8. The light-emitting diode element of claim 1, wherein the first semiconductor layer includes
an epitaxial growth layer of a first conductivity type provided on the active layer side, and
a semiconductor substrate of a first conductivity type provided on the conductive layer side.

9. The light-emitting diode element of claim 8, wherein an average value of a total thickness of the semiconductor substrate and the conductive layer in the third, fourth, and fifth regions is greater than an average value of a thickness of the semiconductor substrate in the sixth region.

10. The light-emitting diode element of claim 8, wherein a minimum value of a total thickness of the semiconductor substrate and the conductive layer in the third, fourth, and fifth regions is greater than a minimum value of a thickness of the semiconductor substrate in the sixth region.

11. The light-emitting diode element of claim 1, wherein when viewed from the rear surface of the first semiconductor layer, the fourth region accords to the second electrode.

12. The light-emitting diode element of claim 1, wherein the first semiconductor layer, the second semiconductor layer, and the active layer are formed of a GaN-based nonpolar or semi-polar semiconductor.

13. The light-emitting diode element of claim 1, wherein the first conductivity type is n-type.

14. A light-emitting diode device, comprising:
a mounting base which has a mounting surface and which includes a first terminal and a second terminal provided on the mounting surface; and
the light-emitting diode element as set forth in claim 1, wherein
the first electrode and the second electrode are arranged so as to be electrically connected to the first terminal and the second terminal, respectively.

* * * * *